(12) United States Patent
Park et al.

(10) Patent No.: US 9,836,080 B2
(45) Date of Patent: Dec. 5, 2017

(54) DISPLAY APPARATUS

(71) Applicant: SAMSUNG ELECTRONICS CO., LTD., Suwon-si (KR)

(72) Inventors: Jae Hoo Park, Suwon-si (KR); Song Hyeon Kim, Suwon-si (KR); Jun Pil Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/091,006

(22) Filed: Apr. 5, 2016

(65) Prior Publication Data
US 2016/0353593 A1    Dec. 1, 2016

(30) Foreign Application Priority Data
May 28, 2015 (KR) .................. 10-2015-0075459

(51) Int. Cl.
*G06F 1/16* (2006.01)
*G02F 1/1333* (2006.01)
(Continued)

(52) U.S. Cl.
CPC ............ *G06F 1/1601* (2013.01); *F16B 5/065* (2013.01); *F16B 5/0635* (2013.01); *F16B 21/02* (2013.01); *F16M 11/041* (2013.01); *F16M 11/16* (2013.01); *G02F 1/133308* (2013.01); *H05K 5/0017* (2013.01); *H05K 5/0217* (2013.01); *H05K 5/0234* (2013.01); *F16B 21/073* (2013.01); *G02F 2001/13332* (2013.01); *G02F 2001/133314* (2013.01); *G02F 2201/465* (2013.01); *G06F 2200/1612* (2013.01)

(58) Field of Classification Search
CPC ... G06F 1/1601; H05K 5/0017; H05K 5/0217
USPC ................. 361/679.24, 679.59; 349/58, 60
See application file for complete search history.

(56) References Cited

U.S. PATENT DOCUMENTS

| 3,916,756 A | 11/1975 | Yoda |
| 6,919,937 B2* | 7/2005 | Kim .................. G02F 1/133308 349/58 |

(Continued)

FOREIGN PATENT DOCUMENTS

| EP | 1201935 A1 | 5/2002 |
| EP | 2897022 A1 | 7/2015 |

(Continued)

OTHER PUBLICATIONS

Communication dated Jul. 29, 2016, issued by the European Patent Office in counterpart European Patent Application No. 16162299.8.

*Primary Examiner* — Nidhi Thaker
(74) *Attorney, Agent, or Firm* — Sughrue Mion, PLLC

(57) ABSTRACT

A display apparatus is provided. The display apparatus includes a display panel, a chassis disposed on at least one among a front side, a lateral side and a rear side of the display panel, and a cover removably coupled with the chassis in a snap button fashion. The display apparatus further includes a first coupling member disposed on one among the chassis and the cover, the first coupling member comprising a moving part that is movable, and a second coupling member disposed in a remaining one among the chassis and the cover, the moving part being removably coupled with the second coupling member.

11 Claims, 30 Drawing Sheets

(51) Int. Cl.

| | | |
|---|---|---|
| *F16M 11/04* | (2006.01) | |
| *F16M 11/16* | (2006.01) | |
| *H05K 5/00* | (2006.01) | |
| *H05K 5/02* | (2006.01) | |
| *F16B 5/06* | (2006.01) | |
| *F16B 21/02* | (2006.01) | |
| *F16B 21/07* | (2006.01) | |

(56) References Cited

U.S. PATENT DOCUMENTS

| | | | |
|---|---|---|---|
| 8,964,367 B2* | 2/2015 | Nonaka | H04N 5/64 248/309.1 |
| 2003/0067740 A1* | 4/2003 | Kim | G02F 1/133308 361/679.27 |
| 2009/0316341 A1* | 12/2009 | Huang | G02F 1/133308 361/679.01 |
| 2010/0208420 A1 | 8/2010 | Yang et al. | |
| 2010/0309617 A1* | 12/2010 | Wang | F16M 11/10 361/679.01 |
| 2011/0116217 A1* | 5/2011 | Lee | H05K 5/0217 361/679.01 |
| 2012/0026422 A1 | 2/2012 | Zhang | |
| 2013/0314867 A1* | 11/2013 | Liu | F16B 2/22 361/679.26 |

FOREIGN PATENT DOCUMENTS

| | | |
|---|---|---|
| KR | 10-2007-0114971 A | 12/2007 |
| KR | 20-2012-0001001 U | 2/2012 |

\* cited by examiner

DISPLAY APPARATUS

CROSS-REFERENCE TO RELATED APPLICATION

This application claims priority from Korean Patent Application No. 10-2015-0075459, filed on May 28, 2015 in the Korean Intellectual Property Office, the disclosure of which is incorporated herein by reference in its entirety.

BACKGROUND

1. Field

Apparatuses consistent with exemplary embodiments relate to a display apparatus, and more particularly, to a display apparatus having an improved structure for enhancing assemblability.

2. Description of the Related Art

A display apparatus converts electrical information into visual information to display the visual information for users. The display apparatus may include at least one among a television, a monitor, and various kinds of portable terminals (for example, a smart phone, a tablet PC, and the like).

The display apparatus may also include at least one among a Cathode Ray Tube (CRT) display, a Light Emitting Diodes (LED) display, an Organic Light Emitting Diode (OLED) display, an Active-Matrix Organic Light Emitting Diode (AMOLED) display, a Liquid Crystal Display (LCD), and an Electronic Paper Display (EPD).

Components of the display apparatus may be coupled through screws. For example, the components of the display apparatus may include various kinds of panels and chassis. To couple the components of the display apparatus through screws, a coupling tool may fasten the screws, which may increase manufacturing costs. Also, because fastening the screws may be a time-consuming job, a manufacturing time may increase accordingly. Furthermore, because the display apparatus may have a thickness exceeding at least the lengths of the threads of the screws to assemble the components, it may be difficult to implement a slim design of the display apparatus.

SUMMARY

Exemplary embodiments may address at least the above problems and/or disadvantages and other disadvantages not described above. Also, the exemplary embodiments are not required to overcome the disadvantages described above, and may not overcome any of the problems described above.

One or more exemplary embodiments provide a display apparatus having an improved structure for enhancing assemblability.

Also, one or more exemplary embodiments provide a display apparatus having an improved structure for implementing a slim product.

According to an aspect of an exemplary embodiment, there is provided a display apparatus including a display panel, a chassis disposed on at least one among a front side, a lateral side and a rear side of the display panel, and a cover removably coupled with the chassis in a snap button fashion. The display apparatus further includes a first coupling member disposed on one among the chassis and the cover, the first coupling member comprising a moving part that is movable, and a second coupling member disposed in a remaining one among the chassis and the cover, the moving part being removably coupled with the second coupling member.

The first coupling member may further include a fixing part disposed on one among the chassis and the cover and coupled with the moving part, the moving part being movable in the fixing part.

The fixing part may include a space in the fixing part, and the moving part may include a body disposed in the space and movable in the space, the body having a width that is narrower than a width of the space, and a head protruding from the body and removably coupled with the second coupling member.

According to an aspect of another exemplary embodiment, there is provided a display apparatus including a display panel, a first chassis disposed on the display panel, and a second chassis disposed behind the display panel and supporting the display panel with the first chassis, the second chassis being removably coupled with the first chassis in a snap button fashion.

The display apparatus may further include first buttons disposed at intervals in the second chassis, each of the first buttons including a coupling groove.

The display apparatus may further include second buttons removably coupled with the first buttons, and each of the second buttons may include a fixing part, and a moving part coupled with the fixing part and slidable in the fixing part, the moving part being removably coupled with the coupling groove.

The fixing part may include a space in the fixing part, and the moving part may include a body disposed in the space and slidable in the space, and a head protruding from the body and removably coupled with the coupling groove.

The display apparatus may further include a connecting member coupled with the first chassis, and a part of the second buttons may be disposed on the connecting member.

The display apparatus may further include a cover removably coupled with the second chassis, and a remaining part of the second buttons may be disposed on the cover.

The display apparatus may further include a stand removably coupled with the second chassis in a snap button fashion and configured to make the display panel stand.

According to an aspect of another exemplary embodiment, there is provided a display apparatus including a display panel, and a first support member and a second support member supporting the display panel. The display apparatus further includes a first coupling member disposed on one among the first support member and the second support member and including a moving part that is movable, and a second coupling member disposed in a remaining one among the first support member and the second support member, the moving part being removably coupled with the second coupling member.

The first coupling member may further include a fixing part disposed on one among the first support member and the second support member and coupled with the moving part, the moving part being movable in the fixing part.

The fixing part may include a space in the fixing part, and the moving part may include a body disposed in the space and movable in the space, and a head protruding from the body and removably coupled with the second coupling member.

The space may have a width that is wider than a width of the body so that the body is movable in the space.

The moving part may be removably coupled with the second coupling member in a snap button fashion.

The first support member may include a first chassis disposed in front of the display panel, and the second support member may include a second chassis disposed behind the display panel.

The first support member may include a chassis disposed behind the display panel, and the second support member may include a cover removably coupled with the chassis.

The first support member may include a chassis disposed behind the display panel, and the second support member may include a stand disposed below the display panel and removably coupled with the chassis.

BRIEF DESCRIPTION OF THE DRAWINGS

The above and/or other aspects will be more apparent by describing exemplary embodiments with reference to the accompanying drawings, in which.

DETAILED DESCRIPTION

Figure 1:
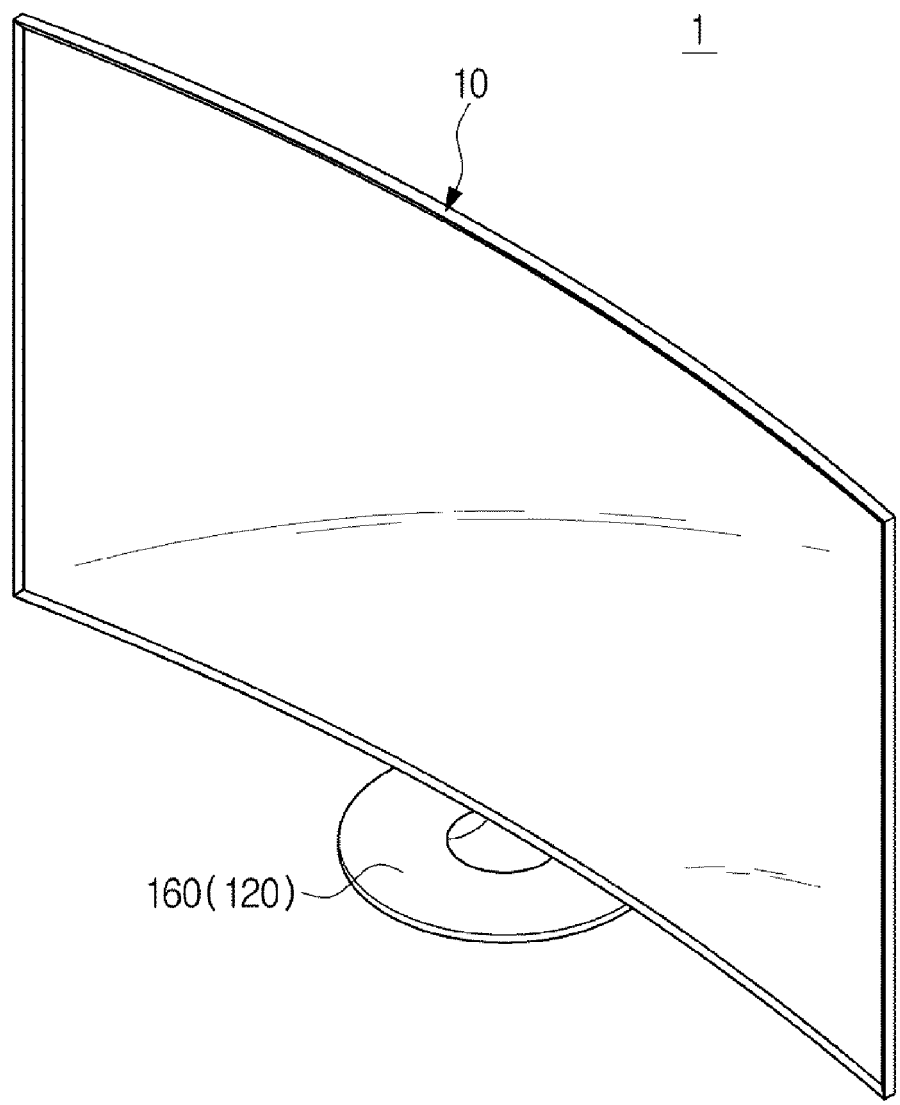
FIG. 1 is a perspective view of a display apparatus according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions may not be described in detail because they would obscure the description with unnecessary detail.

It will be understood that the terms "comprises" and/or "comprising" used herein specify the presence of stated features or components, but do not preclude the presence or addition of one or more other features or components. In addition, the terms such as "unit," "-er (-or)," and "module" described in the specification refer to an element for performing at least one function or operation, and may be implemented in hardware, software, or the combination of hardware and software.

In the following description, the terms "front end," "rear end," "upper portion," "lower portion," "upper end," and "lower end" are defined based on the drawings, and the shapes and positions of the corresponding components are not limited by the terms.

Also, in the following description, a display apparatus according to an exemplary embodiment is assumed to be a curved display apparatus. However, exemplary embodiments can be applied to a Flat Panel Display (FPD) and a bendable or flexible display that can be curved from its flat state.

Also, the display apparatus according to an exemplary embodiment can be applied to a product, such as a television and a monitor, which can be installed in a table, a wall, or a ceiling, or to a portable product, such as a tablet, a laptop computer, a smart phone, and e-book.

Figure 2A:
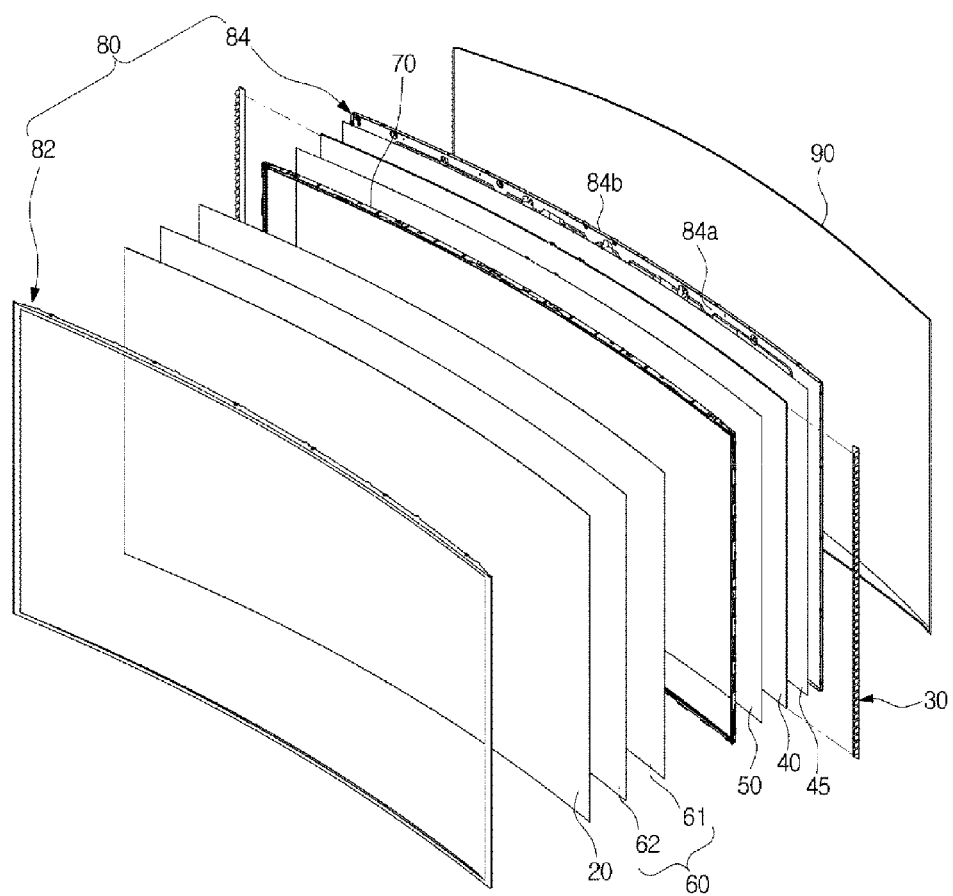
FIG. 2A is an exploded perspective view of a display apparatus according to an exemplary embodiment.
Figure 2B:
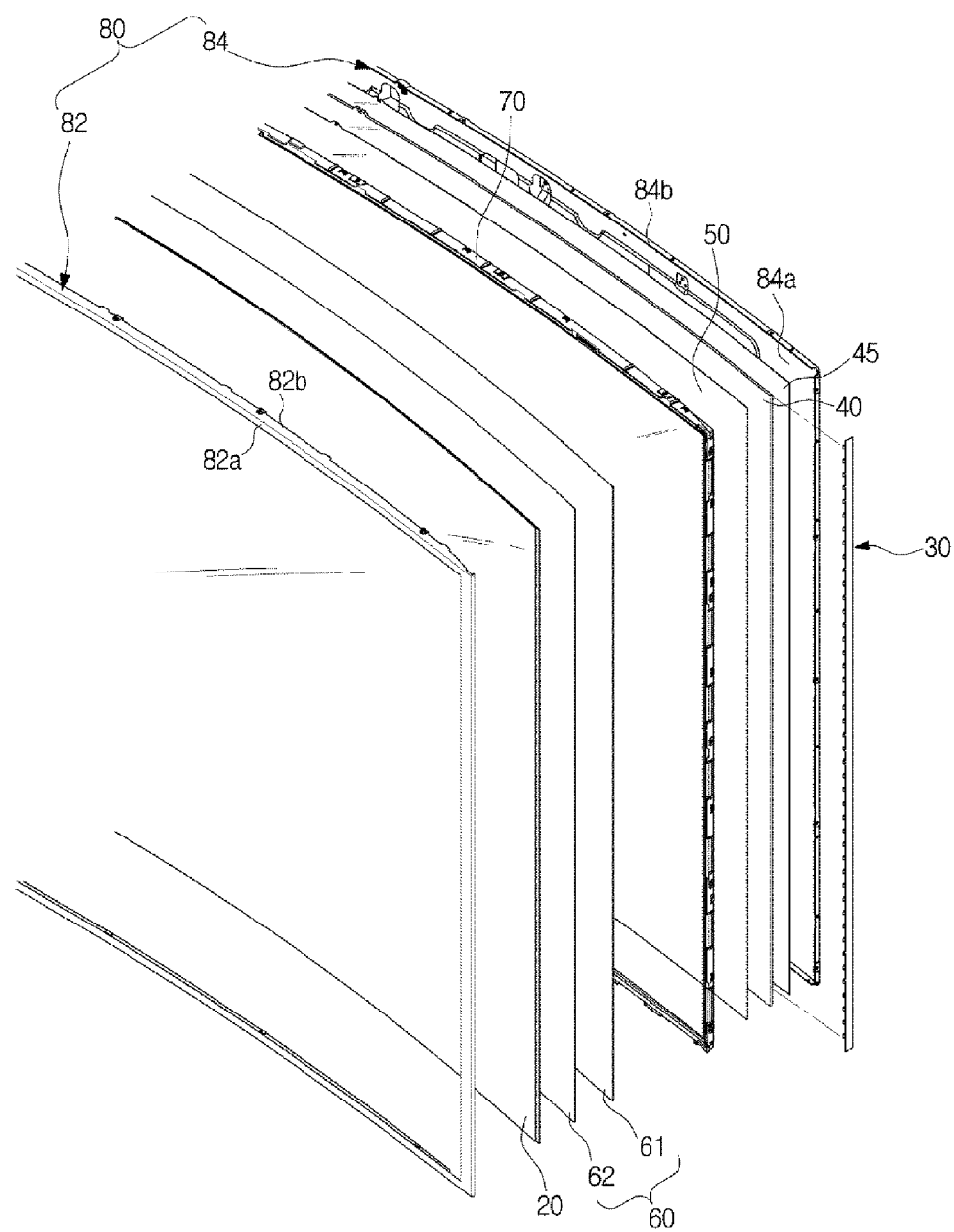
FIG. 2B is an exploded perspective view showing a part of a display module of a display apparatus according to an exemplary embodiment.
Figure 2C:
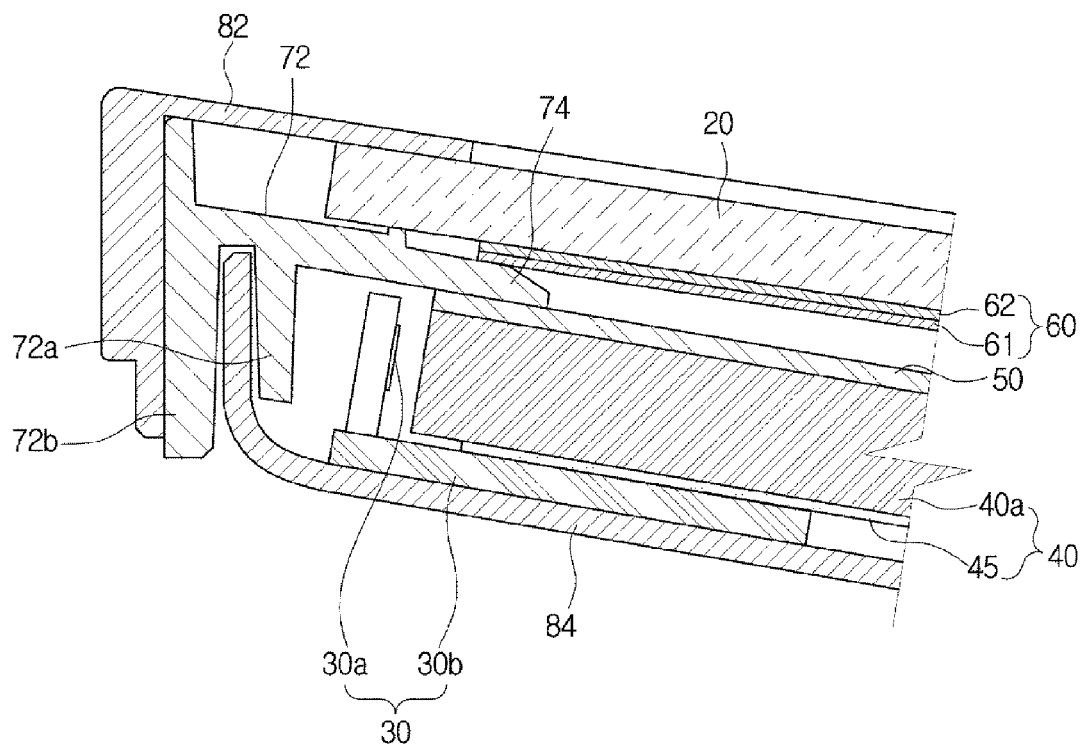
FIG. 2C is a cross-sectional view showing a part of a display module of a display apparatus according to an exemplary embodiment.

FIG. 1 is a perspective view of a display apparatus 1 according to an exemplary embodiment, FIG. 2A is an exploded perspective view of the display apparatus 1 according to an exemplary embodiment, FIG. 2B is an exploded perspective view showing a part of a display module 10 of the display apparatus 1 according to an exemplary embodiment, and FIG. 2C is a cross-sectional view showing the part of the display module 10 of the display apparatus 1 according to an exemplary embodiment.

As shown in FIG. 1, the display apparatus 1 is formed to have a curvature. The display apparatus 1 formed to have a curvature can enhance a user's immersion in images displayed on the screen.

The display apparatus 1 having the curvature may be implemented with a display panel having a curvature. Alternatively, the display apparatus 1 having the curvature may be implemented using a chassis that supports a flat display panel and has a curvature.

As shown in FIGS. 1 to 2C, the display apparatus 1 includes the display module 10, and at least one printed circuit board (PCB) electrically connected to the display module 10.

The at least one PCB may include a power board, a signal processing board, and a driving board. A circuit device for supplying power to the display module 10 may be mounted on the power board. Also, on the signal processing board, a circuit device for receiving external signals and processing them may be mounted. The driving board may be used to drive the display module 10. The power board, the signal processing board, and the driving board may be disposed separately or integratedly.

The display module 10 includes a display panel 20 on which images are displayed, a backlight, and a chassis 80. The backlight includes optical members, such as a light source 30 and a light guide plate 40. That is, the display module 10 includes the light source 30 disposed behind the display panel 20, and the light guide plate 40 to guide light emitted from the light source 30 to the display panel 20, as an edge type backlight. The light guide plate 40 may convert light emitted from the light source 30 into a surface light source and guide the surface light source toward the display panel 20.

The backlight further includes an optical member such as a sheet member. The sheet member includes an optical sheet 60 having optical properties, and a Quantum Dot (QD) sheet 50 configured to improve color reproduction.

The optical sheet 60 includes a diffuser sheet 61 configured to diffuse incident light, and a Dual Brightness Enhancement Film (DBEF) sheet 62 that is a high luminance prism sheet.

The optical sheet 60 may be disposed between the light guide plate 40 and the display panel 20 to change the optical properties of light exiting the light guide plate 40.

The QD sheet 50 may be used to improve color reproduction. The color reproduction is a standard for representing similarity to natural colors, and shows how a wide range of colors is represented on color coordinates. Because color purity of white light is high compared to a technology of converting white LEDs into a color filter, the efficiency of transmission through a color filter may be high, which can increase the total power efficiency of the display apparatus. The QD sheet 50 is also called a "quantum dot sheet."

Quantum dots will be described as follows. If electrons that have been in a valence band receive energy, they are excited to a conduction band. Thereafter, the electrons again lose their energy to fall to the valance band, and at this time, the energy is emitted as light. The quantum dots generate strong fluorescence in a narrow wavelength band, and can generate all colors of visible light according to their sizes. Also, because the quantum dots can themselves generate natural colors, the quantum dots show high color reproduction without color loss. The quantum dots generate light of a shorter wavelength at smaller particles, and light of a longer wavelength at larger particles. The quantum dots may be a compound, such as cadmium selenide (CdSe), cadmium sulfide (CdS), cadmium telluride (CdTe), zinc selenide (ZnSe), zinc telluride (ZnTe), and zinc sulfide (ZnS).

The QD sheet 50 may make light passed through the light guide plate 40 exit therethrough. The QD sheet 50 may closely contact the front surface of the light guide plate 40. That is, the QD sheet 50 may closely contact the front surface of the light guide plate 40 to pass light exiting the light guide plate 40 therethrough.

Because light from LEDs 30a arrives at the QD sheet 50 via the light guide plate 40, the QD sheet 50 may be less influenced by heat from the LEDs 30a, resulting in ensuring high reliability.

The QD sheet 50 may be a yellow QD sheet 50, in correspondence to a blue light emitting device. Blue light emitted from a blue light emitting device may pass through the yellow QD sheet 50 to be converted into white light.

The light guide plate 40 includes a light guide part 40a and a reflector part 45. The reflector part 45 may be a separate sheet.

The chassis 80 may function to support the display panel 20. The chassis 80 includes a first chassis 82, and a second chassis 84 disposed behind the first chassis 82. In other words, the first chassis 82 may be disposed at least one among the front side or a lateral side of the display panel 20. For example, the first chassis 82 may be disposed to cover a part of the front surface of the display panel 20. Alternatively, the first chassis 82 may be disposed to cover the lateral sides of the display panel 20. Alternatively, the first chassis 82 may be disposed to cover a part of the front surface of the display panel 20 and the lateral sides of the display panel 20. The second chassis 84 may be disposed in at least one among the rear surface and lateral sides of the display panel 20. The second chassis 84 may be disposed in the rear surface of the display panel 20. If the first chassis 82 is disposed to cover a part of the front surface of the display panel 20, the second chassis 84 may be disposed in the lateral sides and rear surface of the display panel 20. If the first chassis 82 is disposed to cover the lateral sides of the display panel 20, the second chassis 84 may be disposed in the rear surface of the display panel 20. If the first chassis 82 is disposed to cover a part of the front surface of the display panel 20 and the lateral sides of the display panel 20, the second chassis 84 may be disposed behind the display panel 20. The first chassis 82 may be coupled with the second chassis 84 to support the display panel 20. The first chassis 82 and the second chassis 84 may be integrated into one body to support the display panel 20. A coupling structure of the first chassis 82 and the second chassis 84 will be described later.

In an exemplary embodiment, because the display apparatus 1 has a curvature, the display module 10 installed in the display apparatus 1 may also have a curvature in a left-right direction. Accordingly, the display panel 20, the light guide plate 40, a middle mold 70, the first chassis 82, the second chassis 84, and a cover 90 constituting the display module 10 may each be formed to have a curvature in the left-right direction so that both lateral edges of the individual components protrude forward rather than the center parts. The curvatures of the individual components may be the same value or different values by reason of design. For example, at least one among the display panel 20, the light guide plate 40, and the sheet member may be flat, or may be maintained at a constant curvature by the chassis 80.

The light source 30 may be disposed around at least one among the edges of the light guide plate 40 to irradiate light. The light source 30 may be disposed along the shorter or longer side of the light guide plate 40. That is, the light source 30 can be positioned at any location as long as it is disposed along at least one among the edges of the light guide plate 40 to irradiate light to the light guide plate 40. Also, the light source 30 may be disposed in at least one lateral side of the display module 10 and inside the chassis 80. For example, a pair of light sources 30 may be respectively disposed at both lateral sides of the display module 10, as shown in FIG. 2A, or the light source 30 may be disposed at one lateral side of the display module 10, as shown in FIG. 2B.

The display module 10 further includes the middle mold 70 in which at least one part of the components disposed inside the chassis 80 is rested, together with the chassis 80.

In front of the middle mold 70, the display panel 20 and the first chassis 82 are disposed, and behind the middle mold 70, the second chassis 84 is disposed to support the individual components. Also, the middle mold 70 may separate the display panel 20 from the second chassis 84 to prevent heat generated from the light source 30 from being transferred to the display panel 20 through the second chassis 84.

The first chassis 82 includes a bezel part 82a to cover the edges of the front surface of the display panel 20, and a top side part 82b extending backward from the bezel part 82a to cover the lateral sides of the middle mold 70.

The second chassis 84 includes a bottom part 84a, and a bottom side part 84b extending forward from the edges of the bottom part 84a and coupled with the middle mold 70 to be located inside the middle mold 70.

Because the second chassis 84 has a curved shape of which both lateral edges protrude rather than the center part, the bottom part 84a of the second chassis 84 may also have a curved shape of which both lateral edges protrude forward rather than the center part.

Accordingly, light emitted from the light source 30 may be reflected from the reflector part 45 provided on the bottom part 84a of the second chassis 84 that is curved, and then guided to the display panel 20. That is, the reflector part 45 may guide light irradiated from the light source 30 to the display panel 20.

The light source 30 may include a plurality of LEDs 30a. The light source 30 may be formed with the plurality of LEDs 30 arranged at regular intervals. The light source 30 may be disposed along one edge of the light guide plate 40. The LEDs 30a may include blue LEDs. The light source 30 further includes a PCB 30b. The PCB 30b may send electrical signals to the LEDs 30a to turn on/off the LEDs 30a. The LEDs 30a may be aligned on the PCB 30b to operate. The light source 30 may be disposed in both spaces formed between the light guide plate 40 and the inner surface of the second chassis 84, that is, along the bottom side part 84b of the second chassis 84. Accordingly, light emitted from the light source 30 may be irradiated to the bottom part 84a of the second chassis 84 through a space formed between the light guide plate 40 and the bottom part 84a of the second chassis 84.

The light guide plate 40 may include the reflector part 45 attached on the rear surface. The light guide plate 40 includes the light guide part 40a and the reflector part 45. The reflector part 45 may be positioned on the rear surface of the light guide plate 40 so that light emitted from the light source 30 can be transmitted forward. In other words, the reflector part 45 may reflect light emitted from the light source 30 toward the display panel 20.

The reflector part 45 may be in the shape of a reflecting plate or in the shape of a reflecting sheet. Also, the reflector part 45 may be separated from the light guide plate 40 and disposed on the rear surface of the light guide plate 40, or the reflector part 45 may be integrated into the light guide plate 40. Also, by antireflection coating the rear surface of the light guide plate 40, the same effect as the reflector part 45 can be obtained.

The light guide plate 40 may be configured to transmit light emitted from the light source 30. The light guide plate 40 may be made of a transparent resin material to transmit light emitted from the light source 30. The light guide plate 40 may be spaced by a predetermined distance from the light source 30 to reduce deformation due to heat generated by the light source 30.

The display module 10 further includes the cover 90 forming the rear surface of the display module 10. The cover 90 is disposed behind the second chassis 84 to be opposite to the second chassis 84. The cover 90 is disposed behind the second chassis 84 in such a way to cover at least one part of the second chassis 84. The cover 90 may be removably coupled with the second chassis 84 to form the outer appearance of the display apparatus 1 together with the first chassis 82. The cover 90 may be removably coupled with the second chassis 84 in a snap button fashion. A coupling structure of the cover 90 and the second chassis 84 will be described later.

The display apparatus 1 further includes a connecting member 110 (of FIG. 4) having one end coupled with the first chassis 82 to connect the first chassis 82 to the second chassis 84. For example, the one end of the connecting member 110 may be coupled with the top side part 82b of the first chassis 82. The connecting member 110 may fix the first chassis 82 at the second chassis 84 to prevent the first chassis 82 surrounding the edges of the display panel 20 from departing from the display panel 20 forward from the display panel 20. In other words, the connecting member 110 may fix the first chassis 82 at the second chassis 84 to prevent the first chassis 82 having the bezel part 82a disposed along the front edges of the display panel 20 from departing from the display panel 20 forward from the display panel 20. The connecting member 110 may be formed with a plastic sheet. For example, the connecting member 110 may be formed with a polyethylene terephthalate (PET) sheet.

The display apparatus 1 further includes a stand 120. The stand 120 may be configured to support the display module 10. The stand 120 may be removably coupled with the display module 10. The stand 120 may be removably coupled with the second chassis 84 in the snap button fashion. Accordingly, when a user wants to stand the display apparatus 1 on an installation surface such as a table, the user can couple the display module 10 with the stand 120. When the user wants to hang the display apparatus 1 on an installation surface such as a wall, the user can decouple the display module 10 from the stand 120. The stand 120 includes a support plate 160 that is put on an installation surface. A coupling structure of the stand 120 and the display module 10 will be described later.

Figure 3:
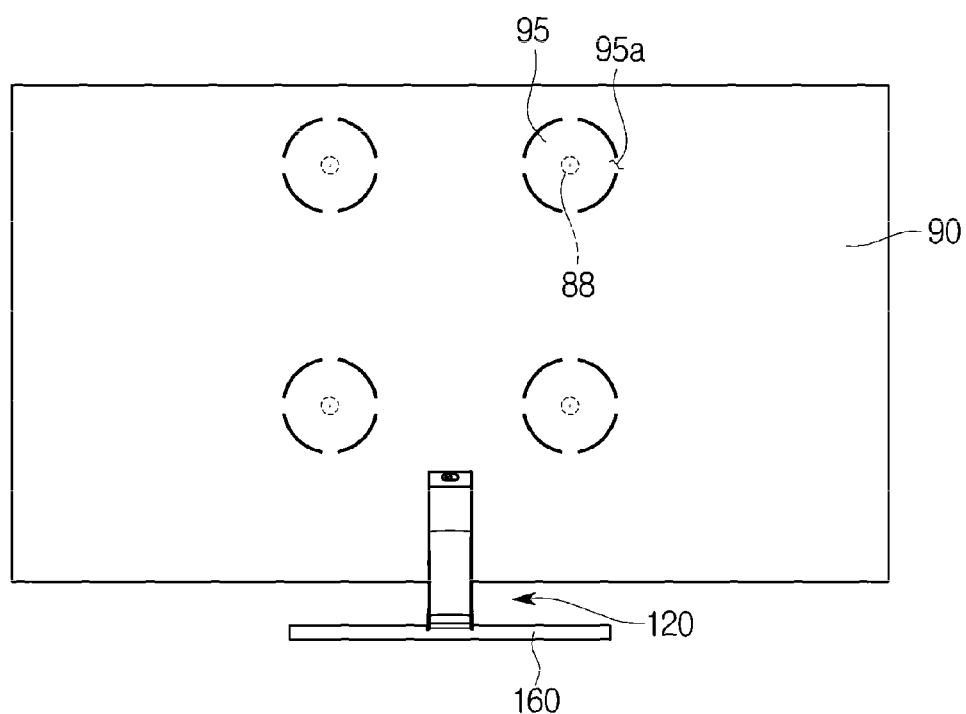
FIG. 3 is a perspective view showing a rear part of a display apparatus according to an exemplary embodiment.

FIG. 3 is a perspective view showing a rear part of the display apparatus 1 according to an exemplary embodiment. Reference numerals not shown in FIG. 3 are shown in FIGS. 1 to 2C.

The display apparatus 1 according to an exemplary embodiment can be used as a stand type display that stands on an installation surface such as a table, or as a wall mounted display that is hung on an installation surface such as a wall. When a user wants to use the display apparatus 1 as a stand type display, the user can couple the display module 10 with the stand 120. When a user wants to use the display apparatus 1 as a wall mounted display, the user can decouple the display module 10 from the stand 120 and then hang the display module 10 on an installation surface.

To use the display apparatus 1 as a wall mounted display, a structure for hanging the display apparatus 1 on an installation surface may be formed in the rear part of the display apparatus 1. Referring to FIG. 3, at least one wall mounting hole 88 is formed in the rear part of the display module 10 of the display apparatus 1. If the wall mounting hole 88 is formed in the second chassis 84, instead of the cover 90 forming the outer appearance of the display module 10, the wall mounting hole 88 will be not exposed to the outside when the display apparatus 1 is used as a stand type display. Accordingly, it is possible to prevent dust from being collected in the wall mounting hole 88 while hiding a unnecessary structure, resulting in a simplified rear appearance of the display apparatus 1.

As shown in FIG. 3, the cover 90 includes at least one temporary cover 95 to hide the wall mounting hole 88 when the display apparatus 1 is used as a stand type display, and to expose the wall mounting hole 88 when the display apparatus 1 is used as a wall mounted display. The at least one temporary cover 95 may be disposed in the cover 90 in correspondence to the at least one wall mounting hole 88. The at least one temporary cover 95 may be integrated into the cover 90. The at least one temporary cover 95 has borders formed in the shape of discontinuous slits 95a such that a user can easily remove the temporary cover 95 from the cover 90.

Figure 4:
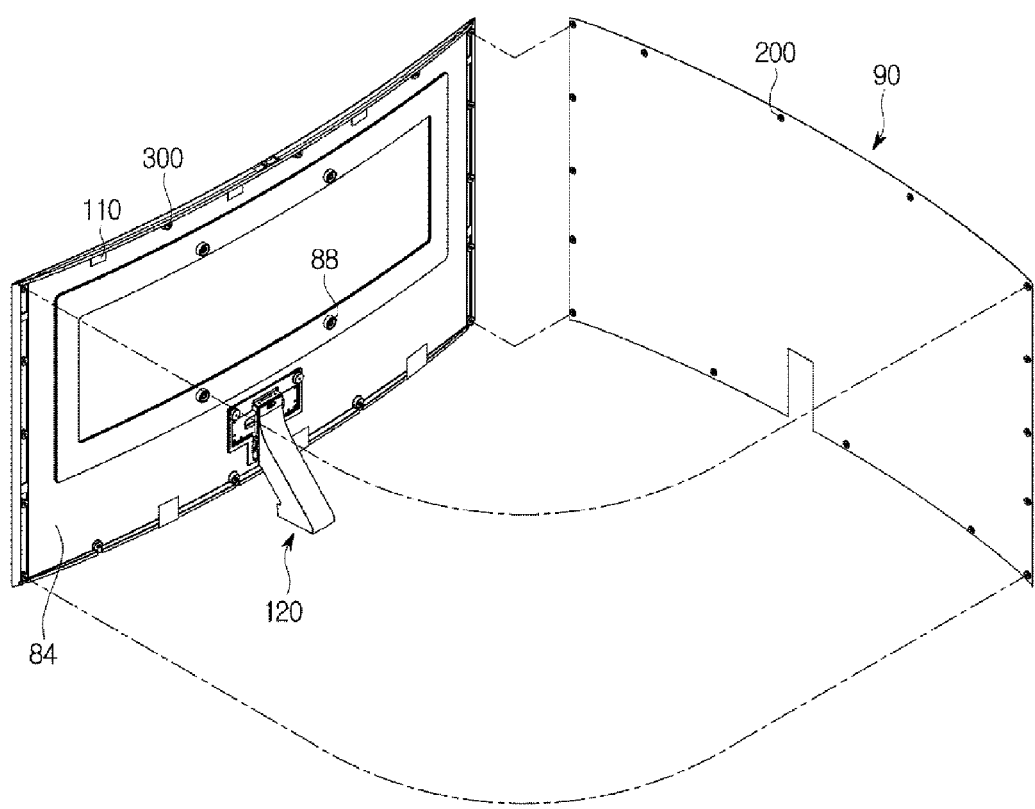
FIG. 4 is a perspective view showing a state in which a cover is separated from a second chassis in a display apparatus according to an exemplary embodiment.

FIG. 4 is a perspective view showing a state in which the cover 90 is separated from the second chassis 84 in the display apparatus 1 according to an exemplary embodiment. Reference numerals not shown in FIG. 4 are shown in FIGS. 1 to 2C. Also, a plurality of first buttons is referred as a second coupling member 300, and a plurality of second buttons is referred as a first coupling member 200.

As shown in FIG. 4, the display apparatus 1 includes the first coupling member 200. Also, the display apparatus 1 further includes the second coupling member 300 that can be removably coupled with the first coupling member 200.

The second chassis 84 may be disposed behind the display panel 20 to support the display panel 20 together with the first chassis 82. The cover 90 may be removably coupled with the second chassis 84 to form the outer appearance of the display apparatus 1 together with the first chassis 82. The connecting member 110 may have one end coupled with the first chassis 82, and connect the first chassis 82 to the second chassis 84.

The first coupling member 200 may be disposed in one among the second chassis 84 and the cover 90. The second coupling member 300 may be disposed in the other one among the second chassis 84 and the cover 90 in correspondence to the first coupling member 200. Also, the first coupling member 200 may be disposed in one among the second chassis 84 and the connecting member 110. The second coupling member 300 may be disposed in the other one among the second chassis 84 and the connecting member 110 in correspondence to the first coupling member 200. Also, the first coupling member 200 may be disposed in one among the second chassis 84 and the stand 120, which will be described later. The second coupling member 300 may be disposed in the other one among the second chassis 84 and the stand 120 in correspondence to the first coupling member 200.

The first coupling member 200 may include a moving part 210 (of FIGS. 5A to 5D and 11A) whose position can change. The moving part 210 may be removably coupled with a coupling groove 311 (of FIGS. 5A and 5C and 11B) of the second coupling member 300. A fixing part 220 (of FIGS. 5A to 5D and 11A) of the first coupling member 200 may be integrated into one among the second chassis 84 and the cover 90 in which the first coupling member 200 is disposed. Also, the fixing part 220 of the first coupling member 200 may be integrated into one among the second chassis 84 and the stand 120 in which the first coupling member 200 is disposed. The second coupling member 300 may be integrated into the other one among the second chassis 84 and the cover 90 in correspondence to the first coupling member 200. Also, the second coupling member 300 may be integrated into the other one among the second chassis 84 and the stand 120 in correspondence to the first coupling member 200.

Hereinafter, it is assumed that the first coupling member 200 is disposed in the cover 90, the connecting member 110, and the stand 120, and the second coupling member 300 is disposed in the second chassis 84.

The second coupling member 300 is disposed along the edges of the second chassis 84. Also, a plurality of second coupling members 300 may be provided, and the plurality of second coupling members 300 may be arranged at predetermined intervals. A part of the plurality of second coupling members 300 may be removably coupled with the first coupling member(s) 200 disposed in the cover 90. The other part of the plurality of second coupling members 300 may be removably coupled with the first coupling member(s) 200 disposed in the first chassis 82 and the connecting member 110. The part of the plurality of second coupling members 300 removably coupled with the first coupling member(s) 200 disposed in the cover 90, and the other part of the plurality of second coupling members 300 removably coupled with the first coupling member(s) 200 disposed in the first chassis 82 and the connecting member 110, may be alternately arranged in the second chassis 84. However, the second coupling members 300 may be arranged in another manner. The case in which the first coupling member 200 is disposed in the stand 120 and the second coupling member 300 is disposed in the second chassis 84 will be described later.

Figure 5A:
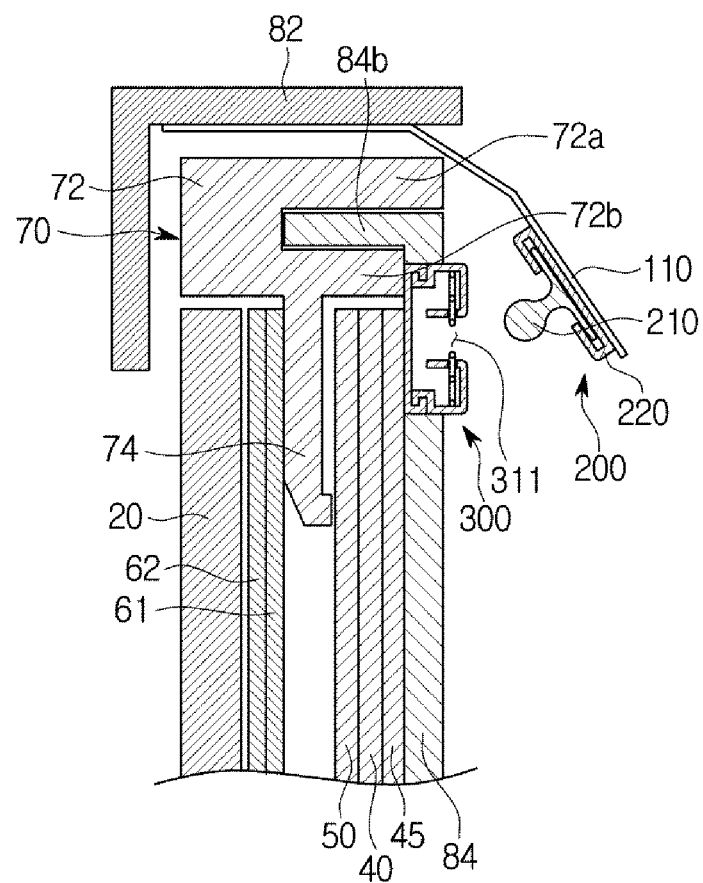
FIGS. 5A and 5B are schematic cross-sectional views for describing a process of assembling a first chassis with a second chassis in a display apparatus according to an exemplary embodiment.
Figure 5B:
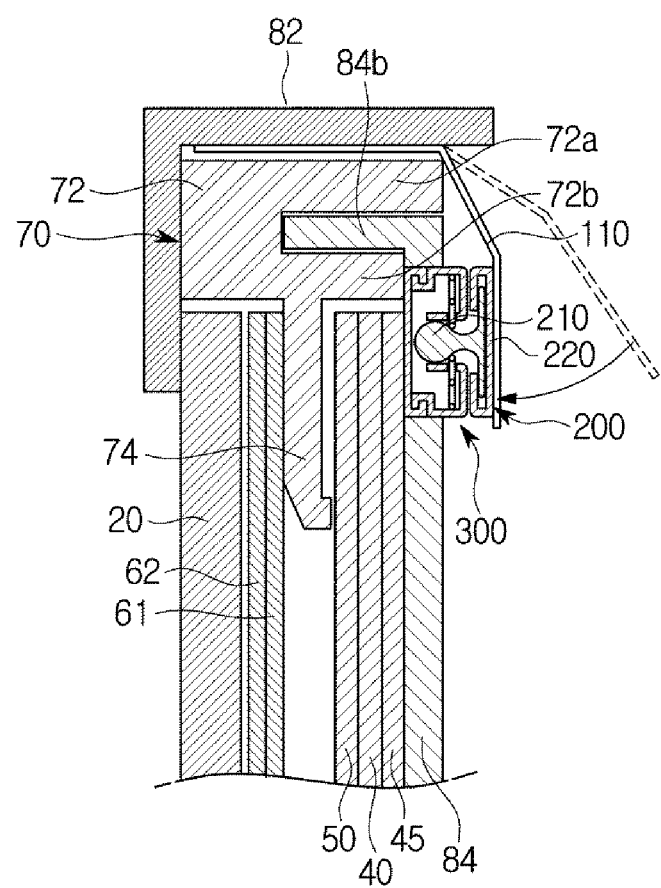
Figure 5C:
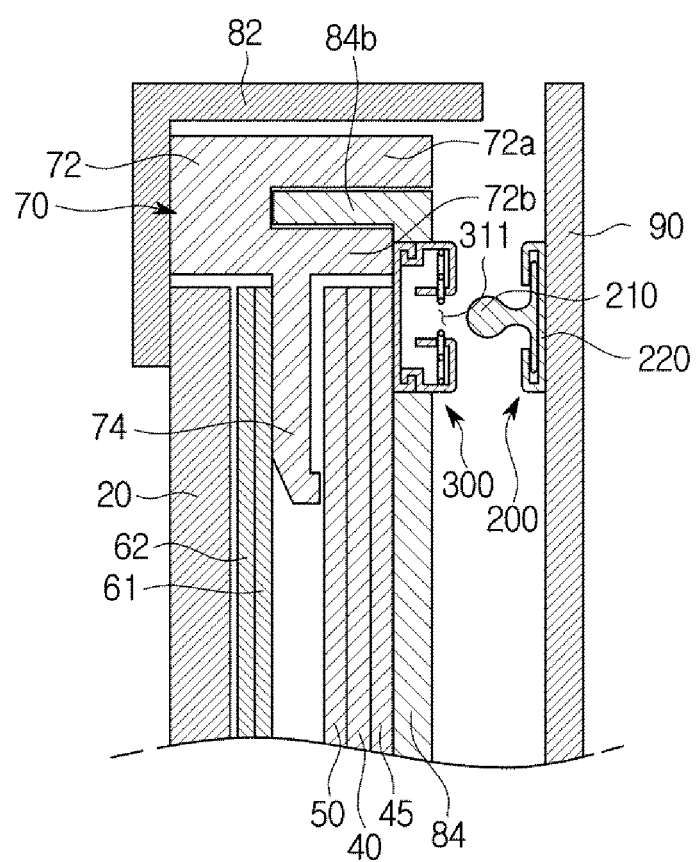
FIGS. 5C and 5D are schematic cross-sectional views for describing a process of assembling a cover with a second chassis in a display apparatus according to an exemplary embodiment.
Figure 5D:
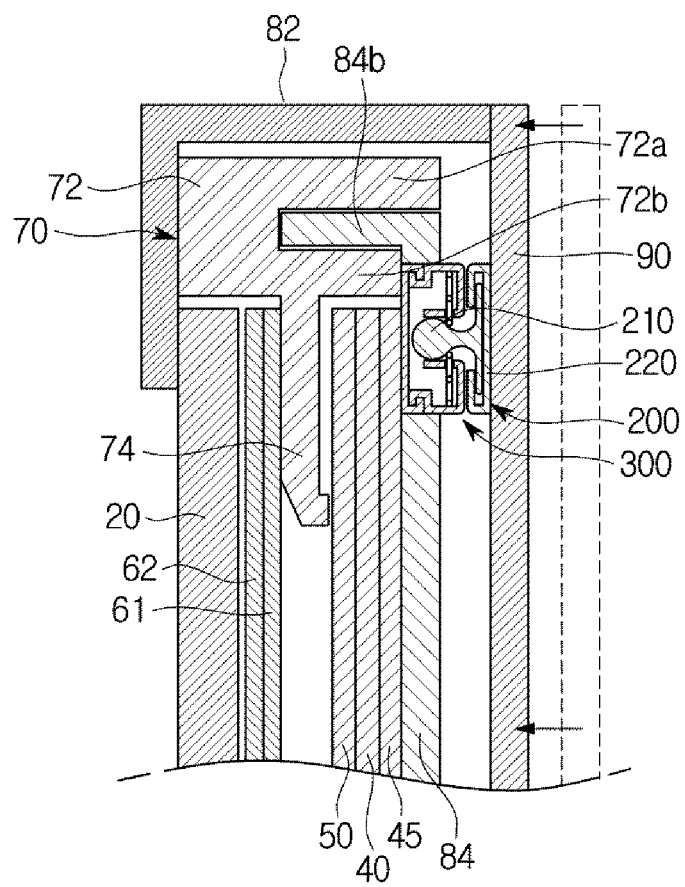

FIGS. 5A and 5B are schematic cross-sectional views for describing a process of assembling the first chassis 82 with the second chassis 84 in the display apparatus 1 according to an exemplary embodiment, and FIGS. 5C and 5D are schematic cross-sectional views for describing a process of assembling the cover 90 with the second chassis 84 in the display apparatus 1 according to an exemplary embodiment.

Figure 16A:
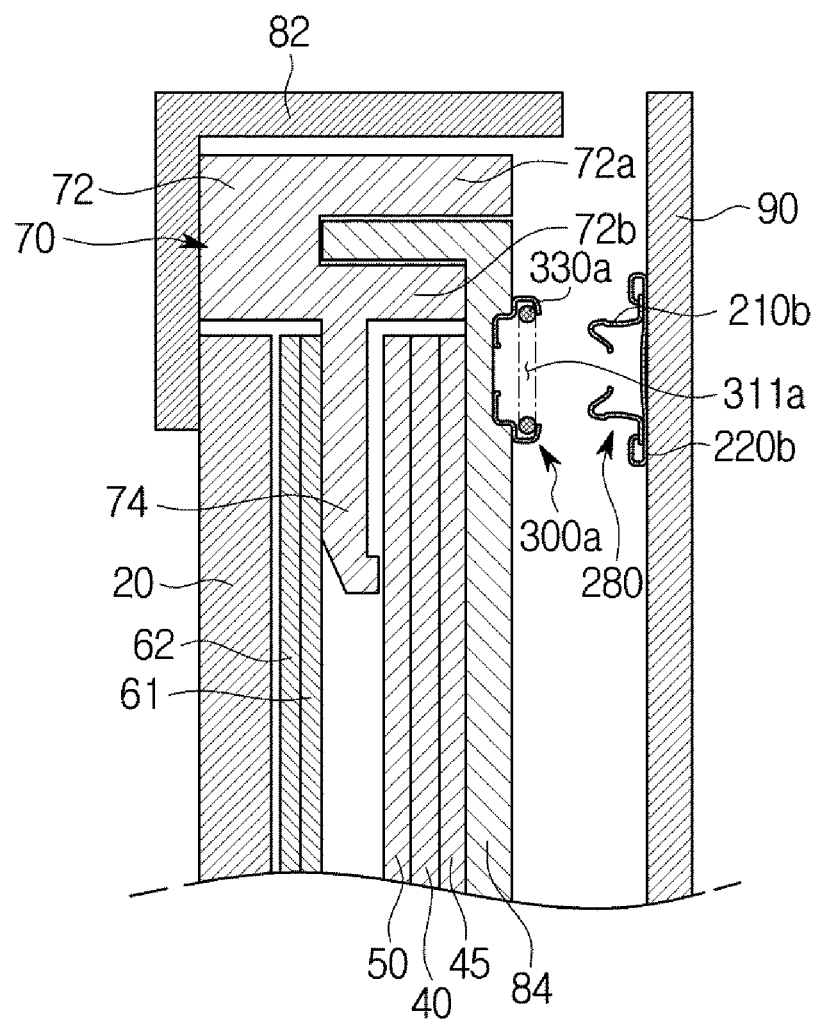
FIGS. 16A and 16B are schematic cross-sectional views for describing a process of assembling a cover and a second chassis to which a first coupling member and a second coupling member are respectively applied according to a fifth exemplary embodiment.
Figure 16B:
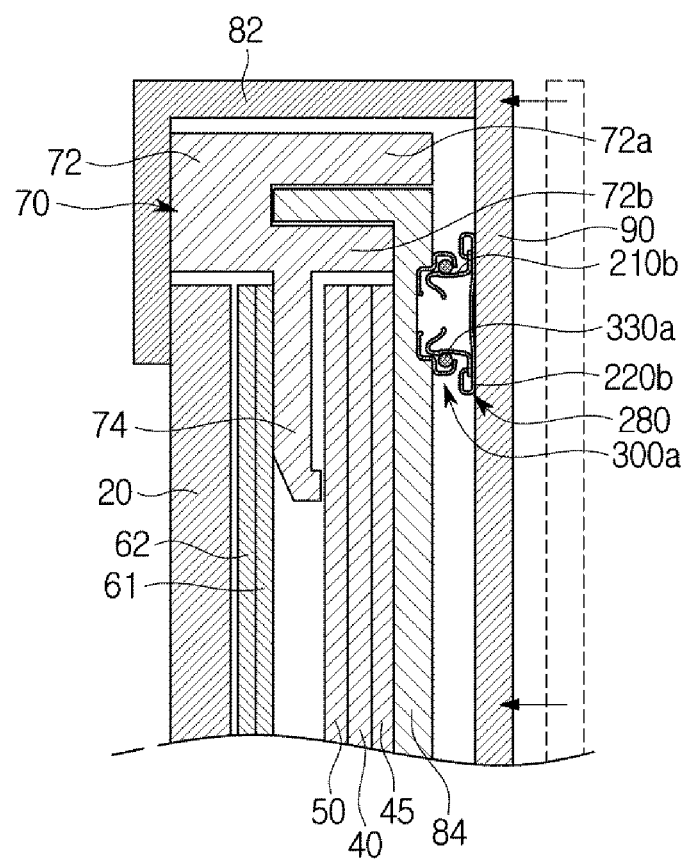

Hereinafter, it is assumed that the first coupling member 200 is disposed in the cover 90 or the connecting member 110, and the second coupling member 300 is disposed in the second chassis 84, like the case shown in FIG. 4. There may be various methods in which the second coupling member 300 is disposed in the second chassis 84. For example, as shown in FIGS. 5A to 5D, the second coupling member 300 is pressed in the second chassis 84 to penetrate the second chassis 84. As another example, as shown in FIGS. 16A and 16B, a second coupling member 300a may be pressed in a groove formed in the second chassis 84. According to still another example, the second coupling member 300 or 300a may be coupled with the surface of the second chassis 84. The second coupling member 300 or 300a may be bonded on the surface of the second chassis 84 by an adhesive material. Alternatively, the second coupling member 300 or 300a may be bonded on the surface of the second chassis 84 by welding. The second coupling member 300 pressed in the second chassis 84 can help implement a slim display module. However, a method in which the second coupling member 300 or 300a is coupled with the second chassis 84 is not limited to the above-described examples, and may be applied in various manners. Before a process of assembling the display apparatus 1 is described, the middle mold 70 will be described as follows.

The display module 10 further includes the middle mold 70. The middle mold 70 may be configured to support the optical sheet 60 and/or the display panel 20 while fixing the light guide plate 40 and the QD sheet 50.

The middle mold 70 includes a middle body 72 and a pressure rib 74.

The middle body 72 is coupled with the second chassis 84. The middle body 72 is coupled with the second chassis 84 along the edges of the second chassis 84.

The middle body 72 includes a first body coupling part 72a coupled with the outside portion of the bottom side part 84b of the second chassis 84, and a second body coupling part 72b coupled with the inside portion of the bottom side part 84b of the second chassis 84. Through this structure, the middle mold 70 is coupled with the second chassis 84 such that the bottom side part 84b of the second chassis 84 is positioned between the first body coupling part 72a and the second body coupling part 72b.

The pressure rib 74 extends from the middle body 72 such that the end of the pressure rib 74 is positioned in front of the light guide plate 40 and the QD sheet 50. When the middle mold 70 is coupled with the second chassis 84, the pressure rib 74 may press the QD sheet 50 and the light guide plate 40 toward the second chassis 84 so that the QD sheet 50 can closely contact the light guide plate 40.

At least one part of the pressure rib 74 is positioned along the edges of the QD sheet 50 and the light guide plate 40.

Hereinafter, a process of assembling the display apparatus 1 will be described.

The light guide plate 40 and the QD sheet 50 may be rested on the second chassis 84. After the light guide plate 40 and the QD sheet 50 are rested on the second chassis 84, the middle mold 70 may be coupled with the second chassis 84. If the middle body 72 is coupled with the second chassis 84, the pressure rib 74 may press the light guide plate 40 and the QD sheet 50 toward the second chassis 84, that is, toward the rear part of the display apparatus 1. Thereafter, the display panel 20 and the optical sheet 60 may be disposed in front of the light guide plate 40. If the display panel 20 is disposed in the front part of the display apparatus 1, the first chassis 82 may be disposed such that the bezel part 82a covers the front edges of the display panel 20, and the top side part 82b covers the lateral sides of the middle mold 70. Then, the first chassis 82 may be fixed at the second chassis 84 by using the connecting member 110 to prevent the first chassis 82 from departing from the display panel 20 forward from the display panel 20. The first chassis 82 may be fixed at the second chassis 84 through coupling between the first coupling member 200 and the second coupling member 300. After the first chassis 82 is fixed at the second chassis 84, the cover 90 may be coupled with the second chassis 84. The cover 90 may be also coupled with the second chassis 84 through coupling between the first coupling member 200 and the second coupling member 300. A process of assembling the stand 120 will be described later.

Figure 6:
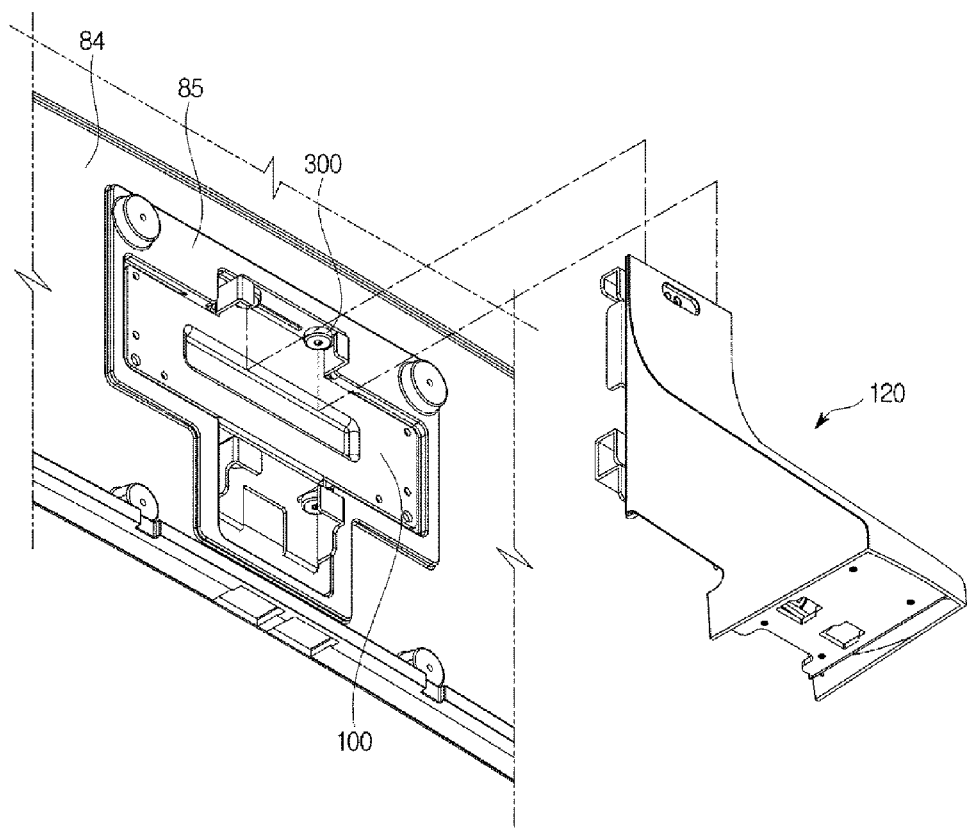
FIG. 6 is a view for describing a process of assembling a second chassis with a stand in the state in which a cover is removed, in a display apparatus according to an exemplary embodiment.
Figure 7:
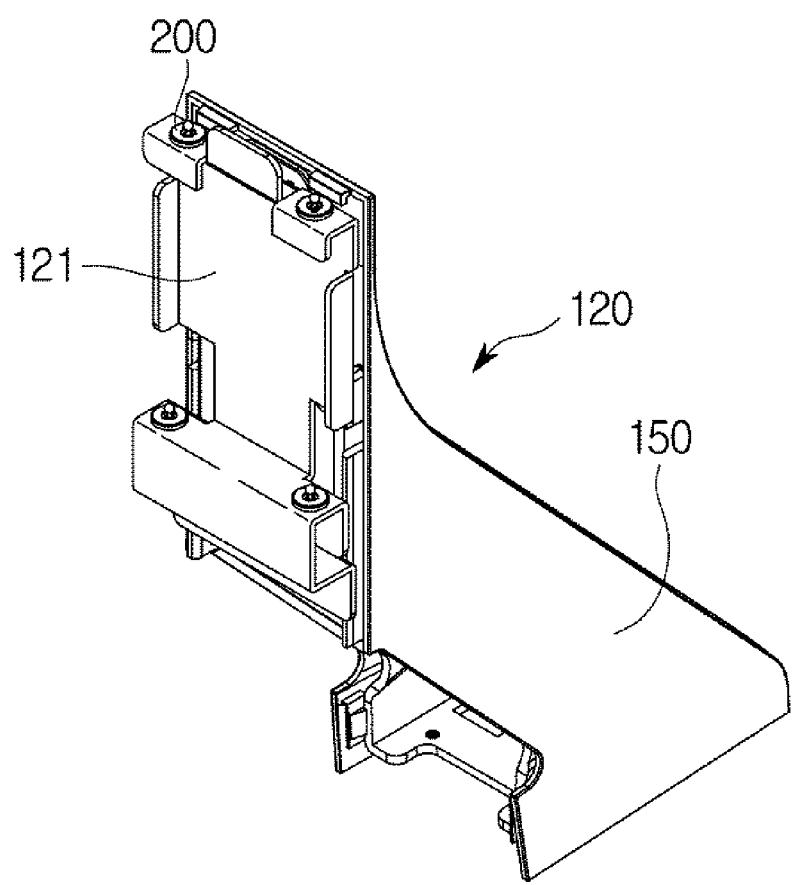
FIG. 7 is a view showing a stand of a display apparatus according to an exemplary embodiment.
Figure 8:
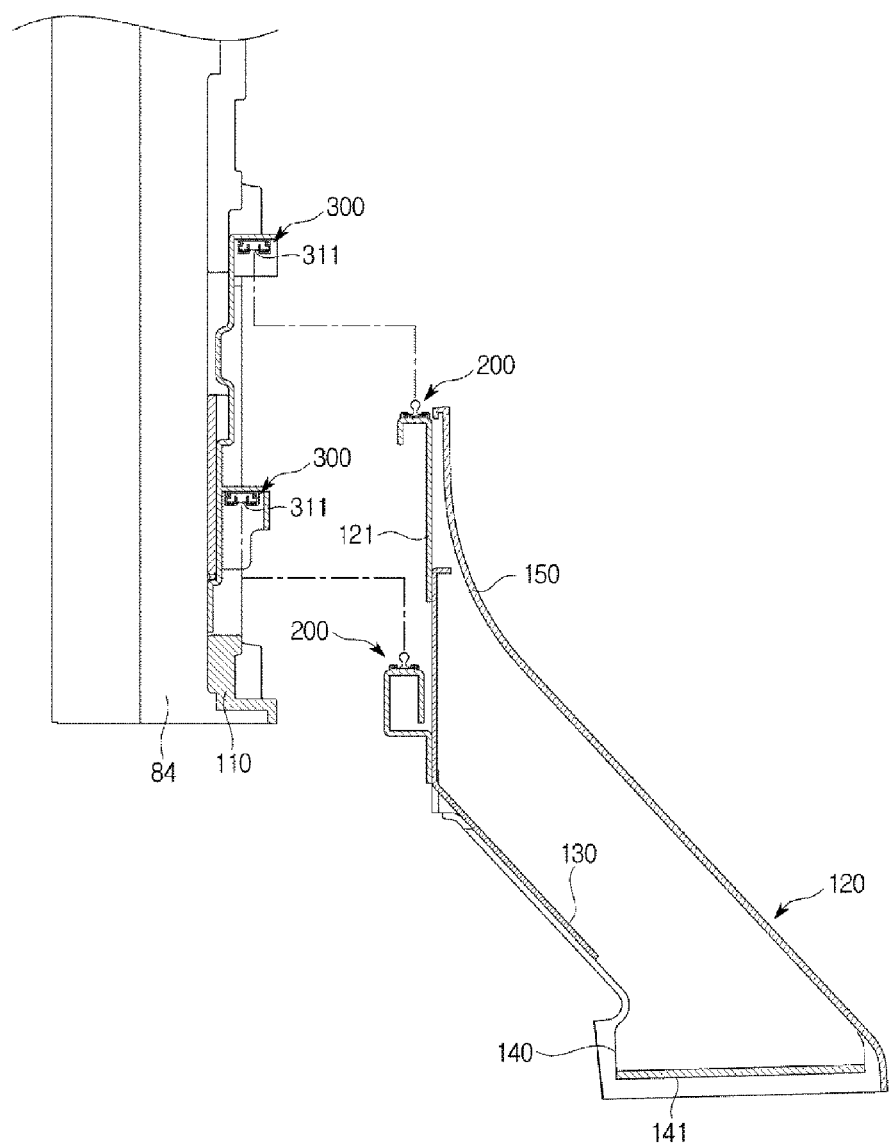
FIG. 8 is a cross-sectional view for describing a process of assembling a first chassis with a stand in a display apparatus according to an exemplary embodiment.
Figure 9:
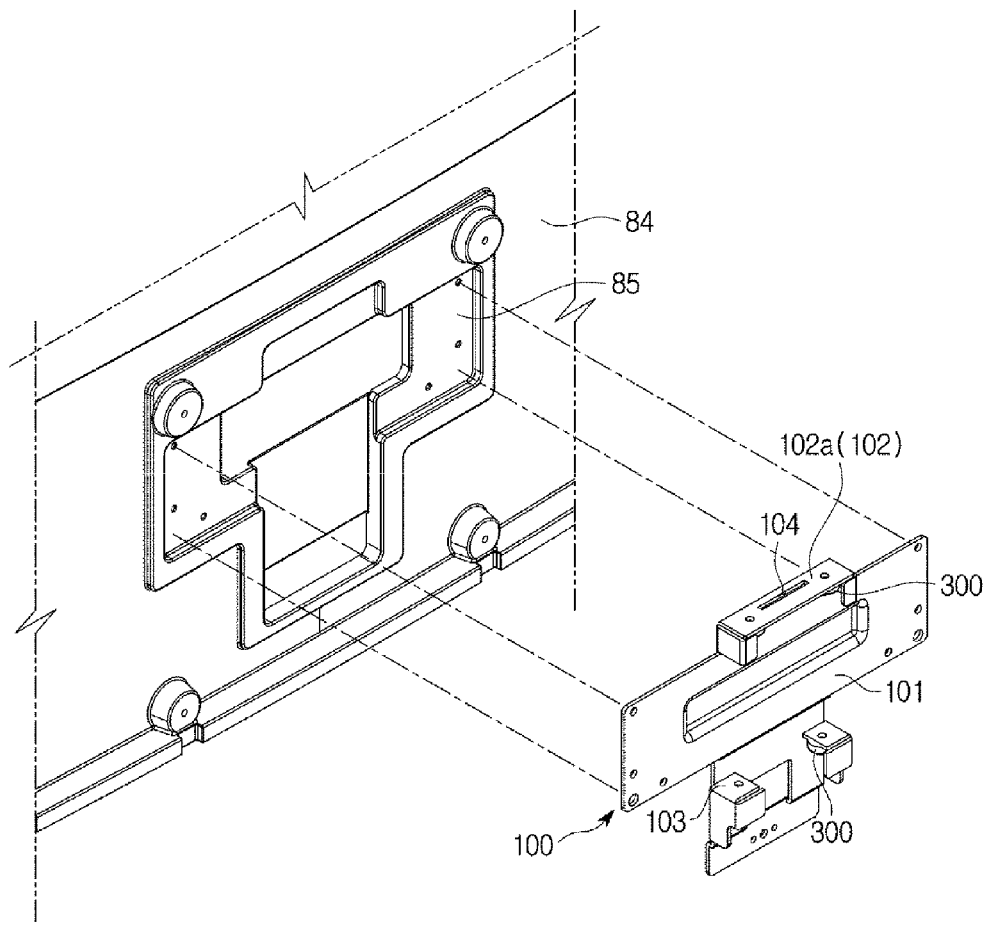
FIG. 9 is an exploded perspective view showing a second chassis and a connecting bracket in a display apparatus according to an exemplary embodiment.
Figure 10:
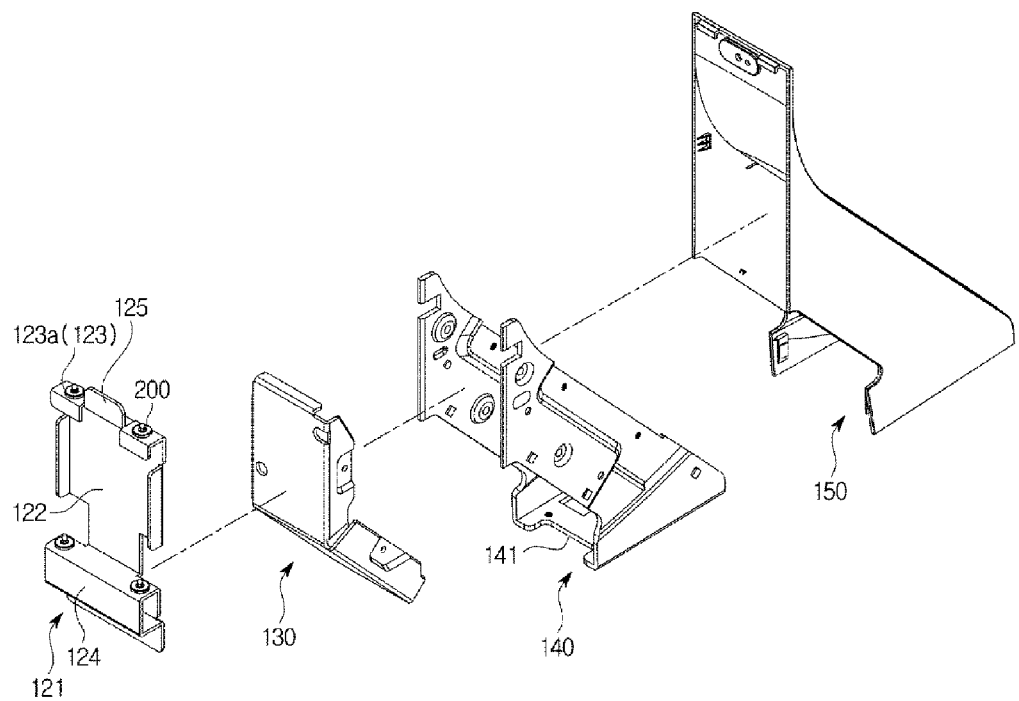
FIG. 10 is an exploded perspective view showing a stand of a display apparatus according to an exemplary embodiment.

FIG. 6 is a view for describing a process of assembling the second chassis 84 with the stand 120 in the state in which the cover 90 is removed, in the display apparatus 1 according to an exemplary embodiment, and FIG. 7 is a view showing the stand 120 of the display apparatus 1 according to an exemplary embodiment. FIG. 8 is a cross-sectional view for describing a process of assembling the first chassis 82 with the stand 120 in the display apparatus 1 according to an exemplary embodiment, and FIG. 9 is an exploded perspective view showing the second chassis 84 and a connecting bracket in the display apparatus 1 according to an exemplary embodiment. FIG. 10 is an exploded perspective view showing the stand 120 of the display apparatus 1 according to an exemplary embodiment. Hereinafter, like the case shown in FIG. 4, it is assumed that the first coupling member 200 is disposed in the stand 120, and the second coupling member 300 is disposed in the second chassis 84. In the following description, a rear cover, which is a component disposed behind the display panel 20, may indicate a component including the cover 90 and the second chassis 84. The rear cover may be included in the display module 10.

As shown in FIGS. 6 to 10, the stand 120 may be configured to support the display module 10. The stand 120 may be removably coupled with the rear cover to support the display module 10. For example, the stand 120 may be removably coupled with the second chassis 84 to support the display module 10. Hereinafter, the case in which the stand 120 is removably coupled with the second chassis 84 will be described.

Referring to FIGS. 7, 8, and 10, the stand 120 includes a plurality of brackets 121, 130, 140, and 150 (also, referred to as a first bracket 121, a second bracket 130, a third bracket 140, and a fourth bracket 150). The plurality of brackets 121, 130, 140, and 150 are coupled with each other to configure the stand 120.

Referring to FIG. 6, in the second chassis 84, a stand installation part 85 is provided. The stand installation part 85 is disposed in the rear part of the second chassis 84 to face the cover 90. The stand installation part 85 may have a depressed shape and be integrated into the second chassis 84. In the stand installation part 85, a connecting bracket 100 is disposed to connect the second chassis 84 to the stand 120. The connecting bracket 100 is fixed at the stand installation part 85. To fix the connecting bracket 100 at the stand installation part 85, a fixing member such as a screw can be used. However, a method of fixing the connecting bracket 100 at the stand installation part 85 is not limited as long as the connecting bracket 100 can be fixed at the stand installation part 85.

Referring to FIG. 9, the connecting bracket 100 includes a fixing plate 101, a first bent part 102, and a second bent part 103. The fixing plate 101 may be fixed at the stand installation part 85. The first bent part 102 is formed in the upper part of the fixing plate 101. The first bent part 102 extends upward from the fixing plate 101 and is bent in the back direction of the display module 10. In one surface 102a of the first bent part 102 facing the upper part of the display module 10, a coupling slot 104 is formed. Also, in the surface 102a of the first bent part 102 in which the coupling slot 104 is formed, one among the first coupling member 200 and the second coupling member 300 may be disposed. The one among the first coupling member 200 and the second coupling member 300 disposed in the first bent part 102 may be disposed in the surface 102a of the first bent part 102 to face the second bent part 103. The second bent part 103 is formed below the fixing plate 101. The second bent part 103 extends from the fixing plate 101 and is bent in the back direction of the display module 10. That is, the first bent part 102 and the second bent part 103 are bent in the same direction. In the second bent part 103, one among the first coupling member 200 and the second coupling member 300 may be disposed. The one among the first coupling member 200 and the second coupling member 300 disposed in the second bent part 103 may be positioned downward from the display module 10.

Referring again to FIGS. 7, 8, and 10, the plurality of brackets 121, 130, 140, and 150 includes the first bracket 121. The first bracket 121 may be coupled with the connecting bracket 100. The first bracket 121 includes a body plate 122, an upper bent part 123, and a lower bent part 124.

The upper bent part 123 is formed in the upper part of the body plate 122. The upper bent part 123 extends from the body plate 122 and is bent in the front direction of the display module 10. If the first bracket 121 is coupled with the connecting bracket 100, the upper bent part 123 may face the first bent part 102 of the connecting bracket 100. Also, if the first bracket 121 is coupled with the connecting bracket 100, the upper bent part 123 may be positioned below the first bent part 102 of the connecting bracket 100.

In one surface 123a of the upper bent part 123 facing in the up direction of the display module 10, a catching part 125 is formed to extend from the upper bent part 123 in the up direction of the display module 10. The catching part 125 may be inserted into and coupled with the coupling slit 104. Through the coupling between the catching part 125 and the coupling slit 104, the first bracket 121 may be primarily coupled with and fixed at the connecting bracket 100.

In the upper bent part 123, the other one among the first coupling member 200 and the second coupling member 300 may be disposed. The other one among the first coupling member 200 and the second coupling member 300 disposed in the upper bent part 123 may be coupled with any one among the first coupling member 200 and the second coupling member 300 disposed in the first bent part 102.

The lower bent part 124 is formed below the body plate 122. The lower bent part 124 extends from the body plate 122 and is bent in the front direction of the display module 10. That is, the upper bent part 123 and the lower bent part 124 are bent in the same direction.

In the lower bent part 124, the other one among the first coupling member 200 and the second coupling member 300 may be disposed. The other one among the first coupling member 200 and the second coupling member 300 disposed in the lower bent part 124 may be coupled with any one among the first coupling member 200 and the second coupling member 300 disposed in the second bent part 103. Through the coupling between any one among the first coupling member 200 and the second coupling member 300 disposed in the connecting bracket 100 and the other one among the first coupling member 200 and the second coupling member 300 disposed in the first bracket 121, the first bracket 121 may be secondarily coupled with and fixed at the connecting bracket 100.

The plurality of brackets 121, 130, 140, and 150 further includes the second bracket 130. The second bracket 130 is positioned behind the first bracket 121. The second bracket 130 is coupled with the first bracket 121 and the third bracket 140. The second bracket 130 is coupled with the inner surface of the third bracket 140.

The plurality of brackets 121, 130, 140, and 150 further includes the third bracket 140. The third bracket 140 is coupled with the outer surface of the second bracket 130.

The second bracket 130 may be coupled with the third bracket 140 at its lateral sides such that the outer surface of the second bracket 130 contacts the inner surface of the third bracket 140 when the second bracket 130 is rested inside the third bracket 140. The third bracket 140 has a support surface 141 to support the stand 120.

The plurality of brackets 121, 130, 140, and 150 further includes the fourth bracket 150. The fourth bracket 150 may form the outer appearance of the stand 120. The fourth bracket 150 may be coupled with at least one among the first bracket 121, the second bracket 130, and the third bracket 140.

Hereinafter, a process of assembling the second chassis 84 with the stand 120 when the second coupling member 300 is disposed in the connecting bracket 100 and the first coupling member 200 is disposed in the first bracket 121 will be described.

The stand 120 may be removably coupled with the second chassis 84. The stand 120 may be disposed behind the second chassis 84 such that the first coupling member 200 disposed in the first bracket 121 of the stand 120 is located close to the second coupling member 300 disposed in the connection bracket 100 of the second chassis 84. Then, the catching part 125 of the first bracket 121 may be coupled with the coupling slit 104 of the connecting bracket 100. After the catching part 125 of the first bracket 121 is coupled with the coupling slit 104 of the connecting bracket 100, the stand 120 may be pressed in the up direction of the display module 10 so that the first coupling member 200 disposed in the upper bent part 123 of the first bracket 121 is coupled with the second coupling member 300 disposed in the first bent part 102 of the connecting bracket 100, and the first coupling member 200 disposed in the lower bent part 124 of the first bracket 121 is coupled with the second coupling member 300 disposed in the second bent part 103 of the connecting bracket 100.

The above description relates to the case in which the stand 120 is coupled with the connecting bracket 100 coupled with and fixed at the second chassis 84; however, the stand 120 may be directly coupled with the second chassis 84. That is, the connecting bracket 100 may be integrated into the second chassis 84.

Figure 11A:
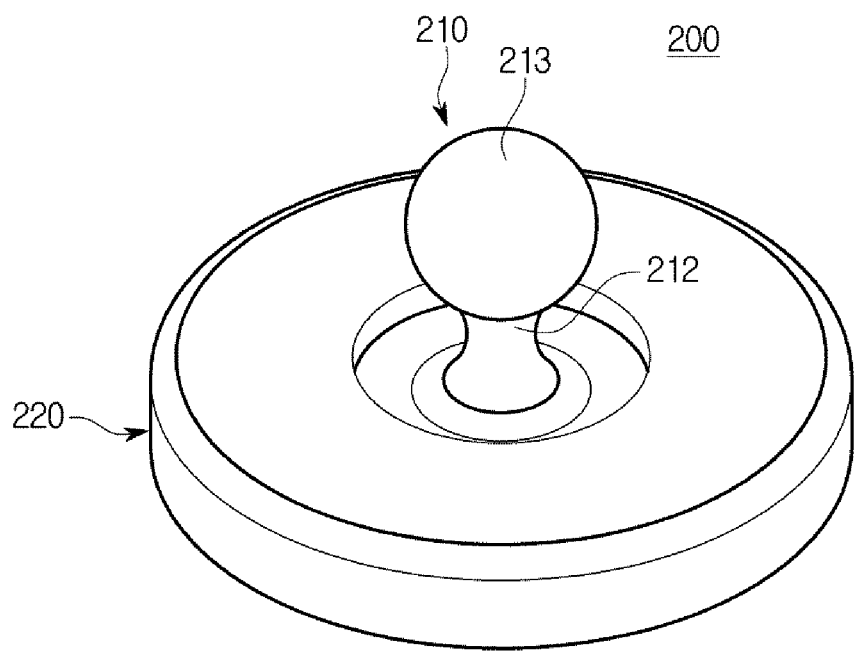
FIG. 11A is a perspective view of a first coupling member according to a first exemplary embodiment.
Figure 11B:
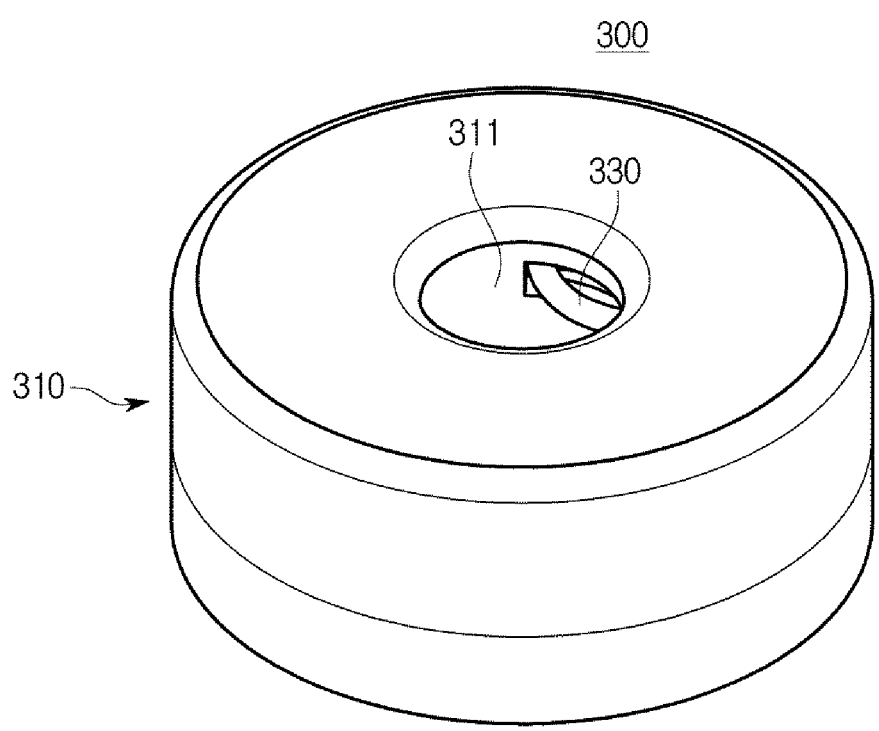
FIG. 11B is a perspective view of a second coupling member according to a first exemplary embodiment.
Figure 11C:
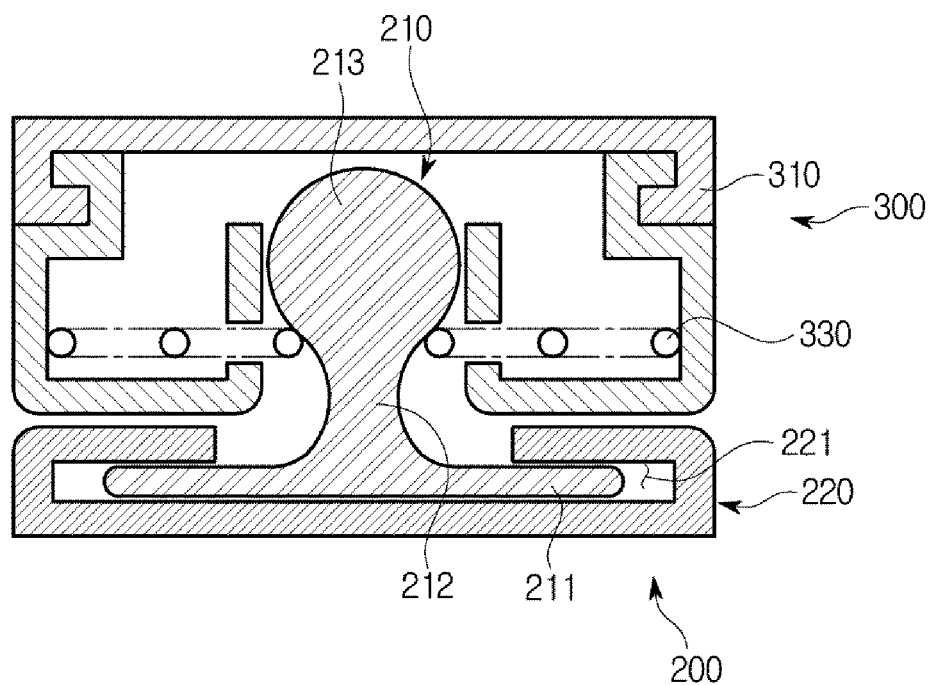
FIG. 11C is a cross-sectional view showing a coupling structure of the first coupling member and the second coupling member according to the first exemplary embodiment.

FIG. 11A is a perspective view of the first coupling member 200 according to a first exemplary embodiment, and FIG. 11B is a perspective view of the second coupling member 300 according to the first exemplary embodiment. FIG. 11C is a cross-sectional view showing a coupling structure of the first coupling member 200 and the second coupling member 300 according to the first exemplary embodiment. A plurality of first buttons are referred as as the second coupling member 300, and a plurality of second buttons are referred as the first coupling member 200. Also, snap buttons can include first coupling members 200, 250, 260, and 270 and the second coupling member 300.

As shown in FIGS. 11A to 11C, the first coupling member 200 includes the moving part 210. The moving part 210 can move to change its position.

The first coupling member 200 further includes the fixing part 220. The moving part 210 may be coupled with the fixing part 220 in such a way to move with respect to the fixing part 220. The fixing part 220 may be fixed at any one among the first chassis 82 and the connecting member 110 in which the first coupling member 200 can be disposed. Also, the fixing part 220 may be fixed at any one among the first chassis 82 and the cover 90 in which the first coupling member 200 can be disposed. Also, the fixing part 220 may be fixed at any one among the first chassis 82 and the stand 120 in which the first coupling member 200 can be disposed. The fixing part 220 may be fixed at any one among the first bracket 121 and the connecting bracket 100 in which the first coupling member 200 can be disposed. The fixing part 220 includes a space 221 inside the fixing part 220.

The moving part 210 includes a body 211, a neck 212, and a head 213. The body 211 may be coupled with the fixing part 220 such that the body 211 can move in the space 221. The head 213 protrudes from the body 211, and may be removably coupled with the second coupling member 300. The neck 212 is formed between the body 211 and the head 213 to connect the body 211 to the head 213. The neck 212 has a width that is narrower than that of the head 213. The space 221 has a width that is wider than that of the body 211 so that the body 211 can move, i.e., slide in the space 211.

The second coupling member 300 includes a housing 310 forming the outer appearance of the second coupling member 300 and including the coupling groove 311. The second coupling member 300 further includes an elastic member 330 disposed in the inner wall of the coupling groove 311. In the inner wall of the coupling groove 311, a plurality of elastic members 330 may be arranged at predetermined intervals. The elastic member 330 may press the neck 212 of the first coupling member 200 when the first coupling member 300 is inserted into the first coupling groove 311 to prevent the first coupling member 200 from departing from the second coupling member 300. The elastic member 330 may include a spring.

Hereinafter, a process of coupling the first coupling member 200 with the second coupling member 300 will be described.

If the first coupling member 200 is coupled with the second coupling member 300, the moving part 210 may be inserted into the coupling groove 311. If the head 213 of the moving part 210 is inserted into the coupling groove 311, the elastic member 330 may contract. If the head 213 of the moving part 210 is completely inserted into the coupling groove 311, a restoring force of the elastic member 330 may be applied. Accordingly, the elastic member 330 may press the neck 212 of the moving part 210, so that the first coupling member 200 may be completely coupled with the second coupling member 300. In this way, the first coupling member 200 can be removably coupled with the second coupling member 300 in the snap button fashion. That is, the moving part 210 of the first coupling member 200 may be removably coupled with the coupling groove 311 of the second coupling member 300 in the snap button fashion.

As such, by using the first coupling member 200 having the moving part 210 and the second coupling member 300 having the coupling groove 311 when assembling the components of the display apparatus 1, it is possible to overcome difficulties in assembling the components when the physical properties of the components have changed due to environmental changes such as changes in temperature. According to an example, if the length of at least one among the second chassis 84 and the cover 90 changes due to a change in temperature when the second chassis 84 is coupled with the cover 90, the position of at least one among the first coupling member 200 and the second coupling member 300 may also change, which may make coupling of the first coupling member 200 and the second coupling member 300 difficult. However, because the moving part 210 of the first coupling member 200 can slide, the first coupling member 200 can be coupled with the second coupling member 300 through the coupling groove 311 even though the position of the at least one among the first coupling member 200 and the second coupling member 300 changes.

Figure 12A:
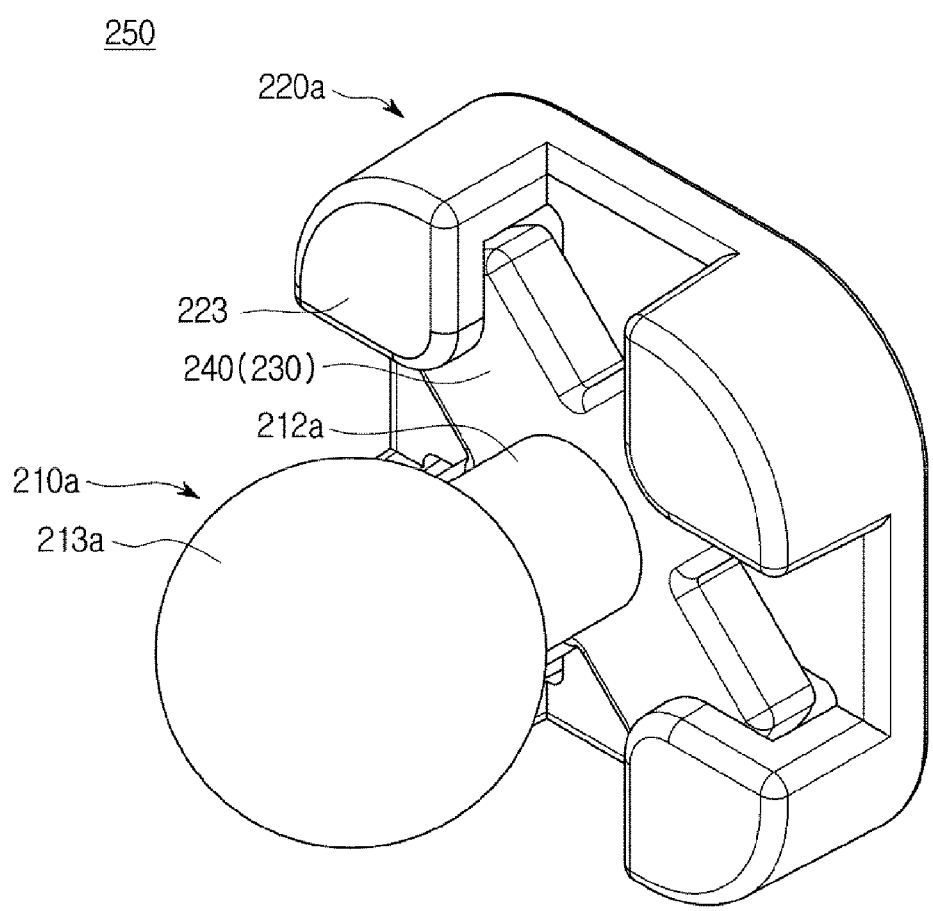
FIG. 12A is a perspective view of a first coupling member according to a second exemplary embodiment.
Figure 12B:
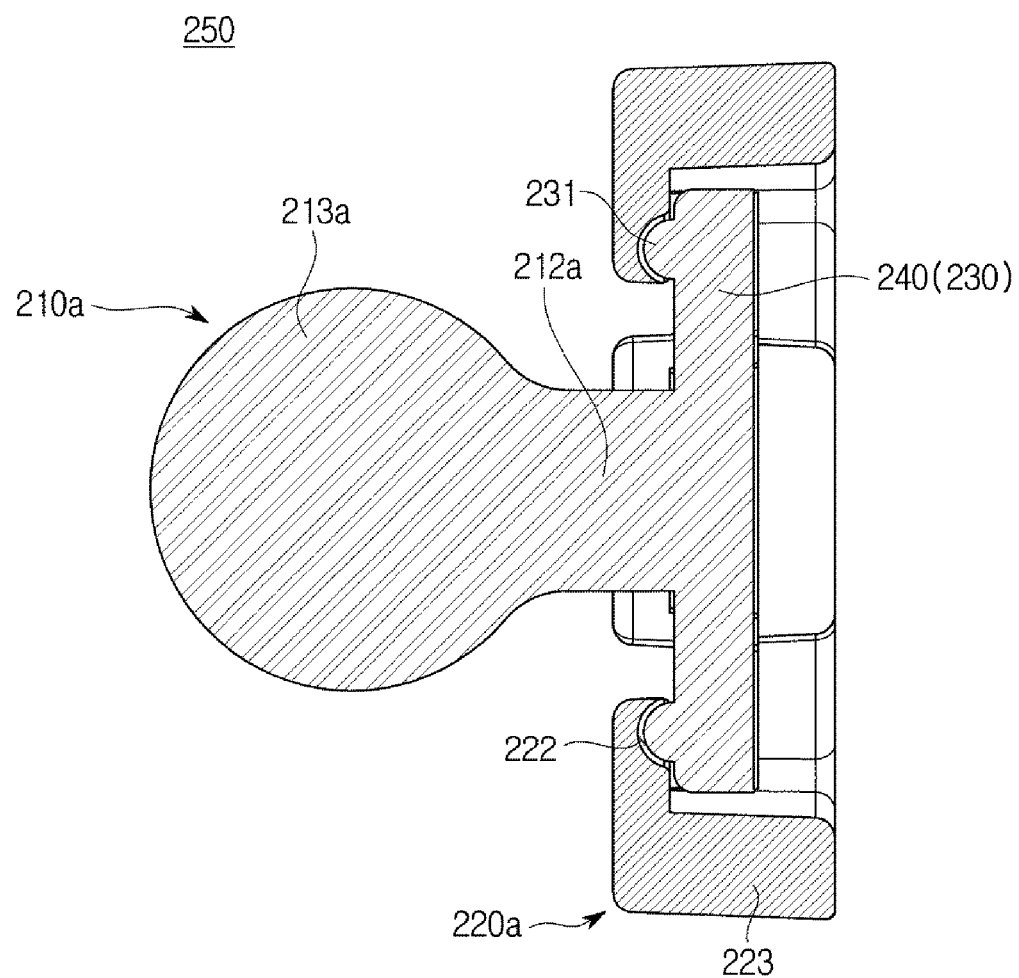
FIG. 12B is a cross-sectional view of the first coupling member according to the second exemplary embodiment.

FIG. 12A is a perspective view of the first coupling member 250 according to a second exemplary embodiment, and FIG. 12B is a cross-sectional view of the first coupling member 250 according to the second exemplary embodiment. Herein, a second coupling member according to the second exemplary embodiment may be the same as the second coupling member 300 according to the first exemplary embodiment described above, and accordingly, a detailed description about the second coupling member according to the second exemplary embodiment will be omitted. Also, descriptions overlapping as those about the first coupling member 200 according to the first exemplary embodiment described above will be omitted. Also, snap buttons can include the first coupling members 200, 250, 260, and 270 and the second coupling member 300.

As shown in FIGS. 12A and 12B, the first coupling member 250 includes a moving part 210a whose position can be adjusted. The moving part 210a may be removably coupled with the coupling groove 311 of the second coupling member 300.

The moving part 210a includes a main body 230. The main body 230 includes at least one protrusion 231. The main body 230 may have a "+" shape. In other words, the main body 230 includes four sub bodies 240 connected to a coupling part. For example, each of the four sub bodies 240 includes the at least one protrusion 231.

The moving part 210a further includes a head 213a. The head 213a protrudes from the main body 230 to be removably coupled with the second coupling member 300.

The moving part 210a further includes a neck 212a. The neck 212a is formed between the main body 230 and the head 213a to connect the main body 230 to the head 213a. The neck 212a has a width that is narrower than that of the head 213a.

The first coupling member 250 further includes a fixing part 220a. The moving part 210a may be movably coupled with the fixing part 220a. The fixing part 220a includes a holder 223 with which the sub bodies 240 are coupled. The fixing part 220a includes four holders 223 with which the four sub bodies 240 are respectively coupled. The fixing part 220a further includes at least one fixing groove 222 with which the at least one protrusion 231 is slidingly coupled. The at least one fixing groove 222 is formed in the holder 223. The number and shape of the at least one fixing groove 222 may correspond to the number and shape of the at least one protrusion 231. The at least one fixing groove 222 has a width that is wider than that of the at least one protrusion 231 such that the at least one protrusion 231 can move, i.e., slide on the at least one fixing groove 222.

Figure 13:
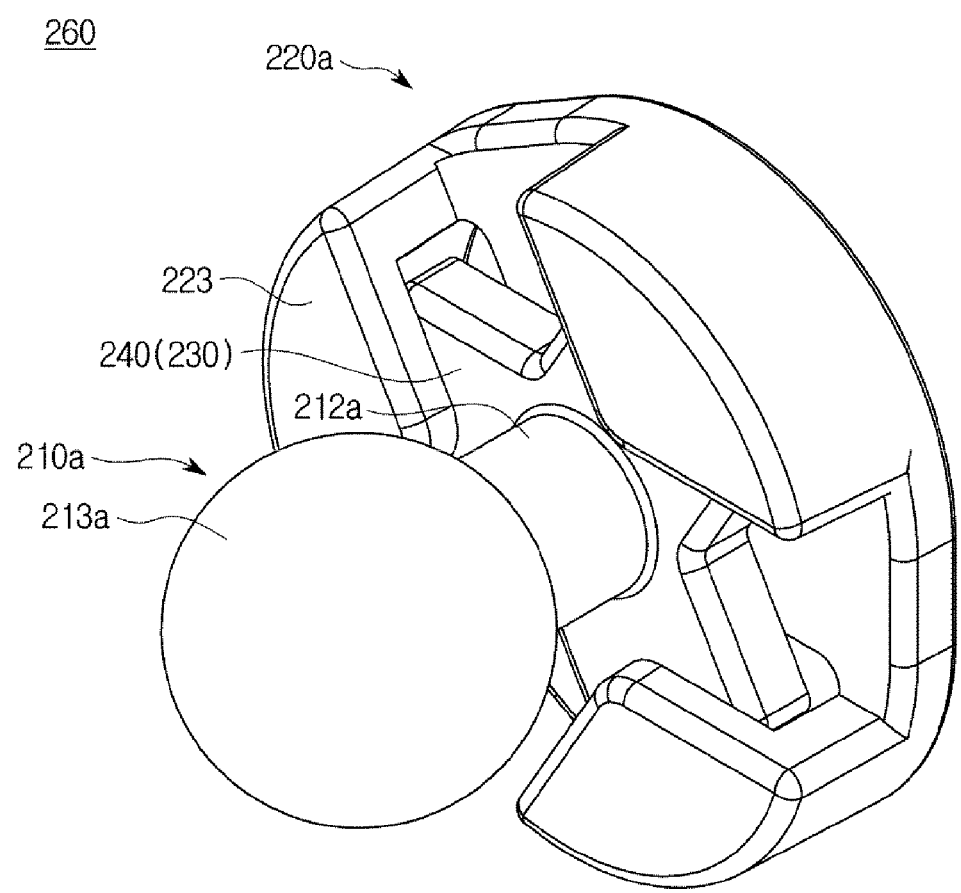
FIG. 13 is a perspective view of a first coupling member according to a third exemplary embodiment, in a display apparatus according to an exemplary embodiment.

FIG. 13 is a perspective view of the first coupling member 260 according to a third exemplary embodiment. Herein, a second coupling member according to the third exemplary embodiment may be the same as the second coupling member 300 according to the first exemplary embodiment described above, and accordingly, a detailed description about the second coupling member according to the third exemplary embodiment will be omitted. Also, descriptions overlapping as those about the first coupling member 200 according to the first exemplary embodiment described above will be omitted. Also, components that are the same as or similar to those in the first coupling member 250 according to the second exemplary embodiment are indicated by same or similar component numerals. Also, snap buttons can include the first coupling members 200, 250, 260, and 270 and the second coupling member 300.

As shown in FIG. 13, the first coupling member 260 includes the moving part 210a whose position can be adjusted. The moving part 210a may be removably coupled with the coupling groove 311 of the second coupling member 300.

The moving part 210a includes the main body 230. The main body 230 may include the at least one protrusion 231. The main body 230 includes three sub bodies 240 connected to a coupling part. For example, each of the three sub bodies 240 may have the at least one protrusion 231.

The moving part 210a further includes the head 213a. The head 213a protrudes from the main body 230 to be removably coupled with the second coupling member 300.

The moving part 210a further includes the neck 212a. The neck 212a is formed between the main body 230 and the head 213a to connect the main body 230 to the head 213a. The neck 212a has a width that is narrower than that of the head 213a.

The first coupling member 260 further includes the fixing part 220a. The moving part 210a may be movably coupled with the fixing part 220a. The fixing part 220a includes the holder 223 with which the sub bodies 240 are coupled. The fixing part 220a includes three holders 223 with which the three sub bodies 240 are respectively coupled. The fixing part 220a may further include the at least one fixing groove 222 with which the at least one protrusion 231 is slidingly coupled. The at least one fixing groove 222 may be formed in the holder 223. The number and shape of the at least one fixing groove 222 may correspond to the number and shape of the at least one protrusion 231. The at least one fixing groove 222 has a width that is wider than that of the at least one protrusion 231 such that the at least one protrusion 231 can move, i.e., slide on the at least one fixing groove 222.

Figure 14:
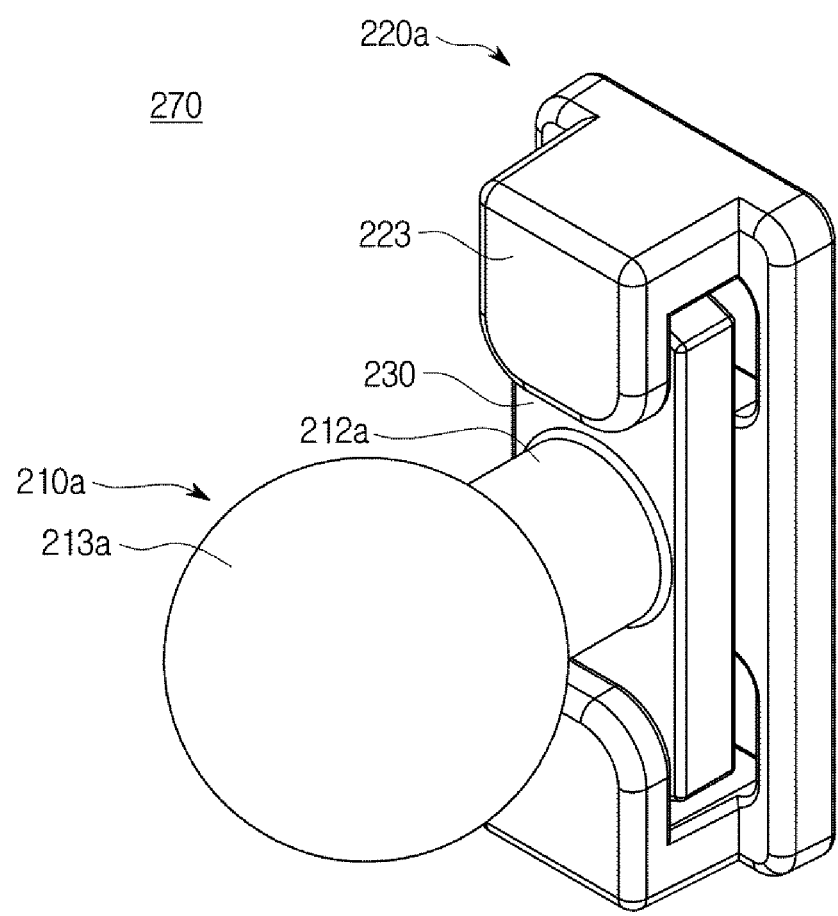
FIG. 14 is a perspective view of a first coupling member according to a fourth exemplary embodiment.

FIG. 14 is a perspective view of the first coupling member 270 according to a fourth exemplary embodiment. Herein, a second coupling member according to the fourth exemplary embodiment may be the same as the second coupling member 300 according to the first exemplary embodiment described above, and accordingly, a detailed description about the second coupling member according to the fourth exemplary embodiment will be omitted. Also, descriptions overlapping as those about the first coupling member 200 according to the first exemplary embodiment described above will be omitted. Also, components that are the same as or similar to those in the first coupling member 250 according to the second exemplary embodiment are indicated by same or similar component numerals. Also, snap buttons can include the first coupling members 200, 250, 260, and 270 and the second coupling member 300.

As shown in FIG. 14, the first coupling member 270 includes the moving part 210a whose position can be adjusted. The moving part 210a may be removably coupled with the coupling groove 311 of the second coupling member 300.

The moving part 210a includes the main body 230. The main body 230 may include the at least one protrusion 231.

The moving part 210a further includes the head 213a. The head 213a protrudes from the main body 230, and be removably coupled with the second coupling member 300.

The moving part 210a further includes the neck 212a. The neck 212a is formed between the main body 230 and the head 213a to connect the main body 230 to the head 213a. The neck 212a has a width that is narrower than that of the head 213a.

The first coupling member 270 further includes the fixing part 220a. The moving part 210a may be movably coupled with the fixing part 220a. The fixing part 220a includes the holder 223 with which the main body 230 is coupled. The fixing part 220a includes two holders 223 with which both ends of the main body 230 are respectively coupled. The fixing part 220a may further include the at least one fixing groove 222 with which the at least one protrusion 231 is slidingly coupled. The at least one fixing groove 222 may be formed in the holder 223. The number and shape of the at least one fixing groove 222 may correspond to the number and shape of the at least one protrusion 231. The at least one fixing groove 222 has a width that is wider than that of the at least one protrusion 231 such that the at least one protrusion 231 can move, i.e., slide on the at least one fixing groove 222.

The shape of the first coupling member 200, 250, 260, or 270 is not limited to the above-described shapes as long as the first coupling member 200, 250, 260, or 270 includes the moving part 210 or 210a whose position can be adjusted.

The first coupling member 200, 250, 260, or 270 and the second coupling member 300 may be used to assemble other components of the display apparatus 1, as well as the first chassis 82, the second chassis 84, the cover 90, and the stand 120. According to another aspect of the display apparatus 1, the display apparatus 1 may include a support structure including a first support member and a second support member to support the display panel 20. The first coupling member 200, 250, 260, or 270 may be provided in any one among the first support member and the second support member, and the second coupling member 300 may be provided in the other one among the first support member and the second support member. For example, the first support member may include the first chassis 82, and the second support member may include the second chassis 84. As another example, the first support member may include the second chassis 84, and the second support member may include the cover 90. As still another example, the first support member may include the second chassis 84, and the second support member may include the stand 120. The first coupling member 200, 250, 260, or 270 and the second coupling member 300 may be also used in other components of the display apparatus 1, as well as the support structure for supporting the display panel 20.

The above description relates to the case in which the first chassis 82 is removably coupled with the second chassis 84 by using the connecting member 110; however, the first chassis 82 may be directly removably coupled with the second chassis 84.

Figure 15A:
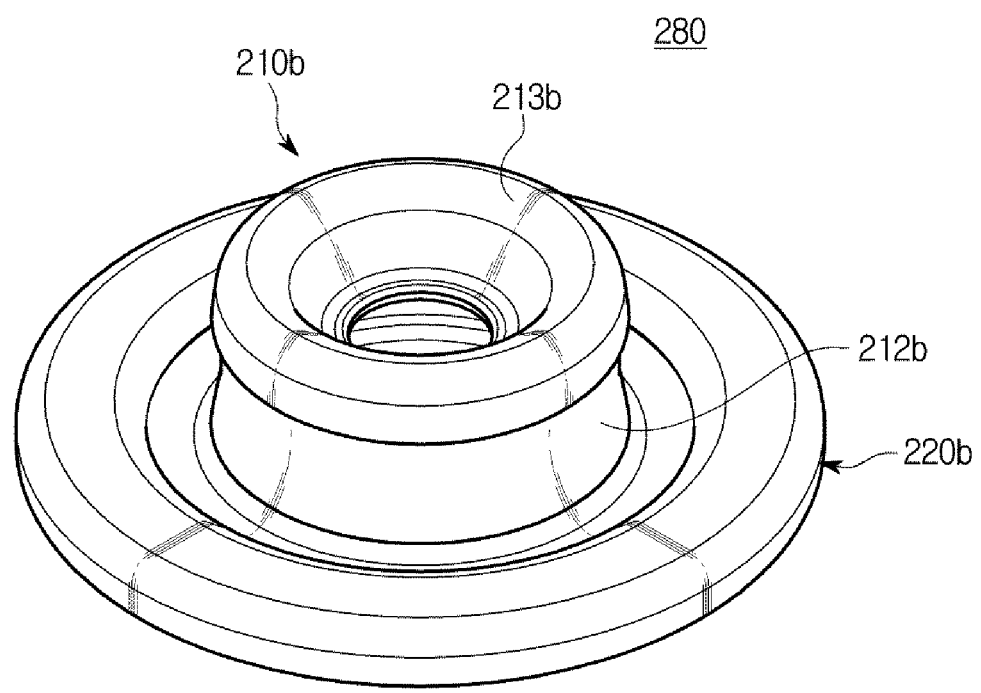
FIG. 15A is a perspective view of a first coupling member according to a fifth exemplary embodiment.
Figure 15B:
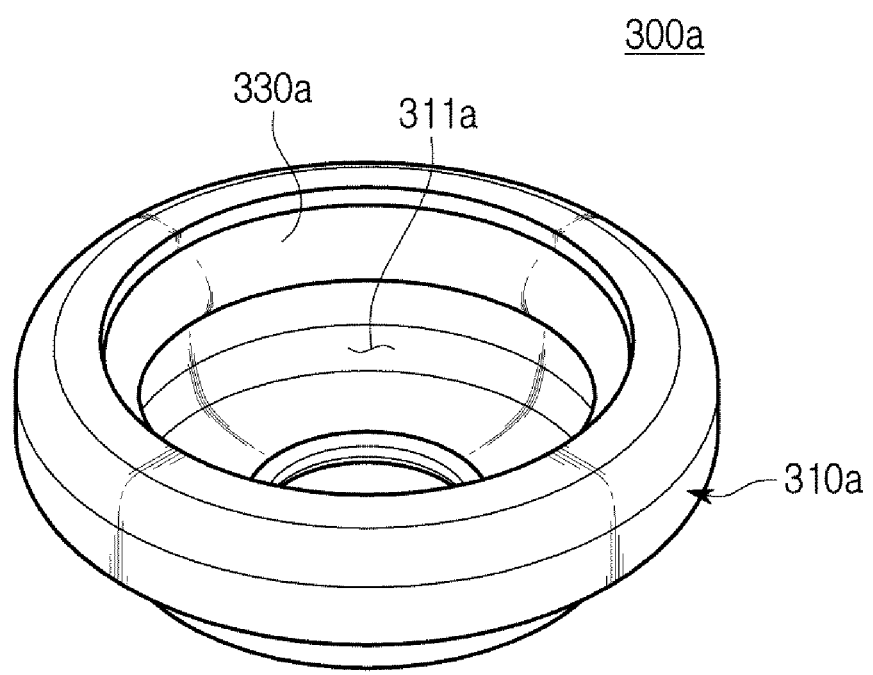
FIG. 15B is a perspective view of a second coupling member according to the fifth exemplary embodiment.
Figure 15C:
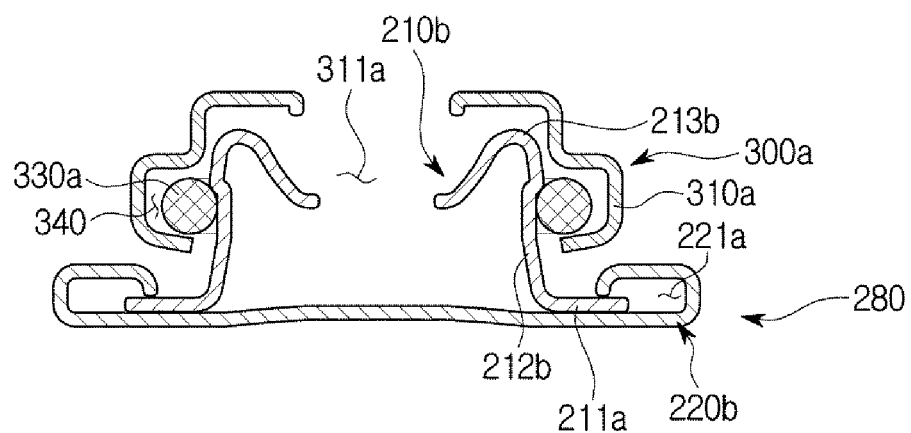
FIG. 15C is a cross-sectional view showing a coupling structure of the first coupling member and the second coupling member according to the fifth exemplary embodiment.

FIG. 15A is a perspective view of a first coupling member 280 according to a fifth exemplary embodiment, and FIG. 15B is a perspective view of a second coupling member 300a according to the fifth exemplary embodiment. FIG. 15C is a cross-sectional view showing a coupling structure of the first coupling member 280 and the second coupling member 300a according to the fifth exemplary embodiment. Also, snap buttons can include the first coupling members 200, 250, 260, 270, and 280 and the second coupling members 300 and 300a.

As shown in FIGS. 15A, 15B, and 15C, the first coupling member 280 includes a moving part 210b. The moving part 210b may move to change its position. The moving part 210b may slide to change its position.

The first coupling member 280 further includes a fixing part 220b. The moving part 210b may be movably, i.e., slidingly coupled with the fixing part 220b. The fixing part 220b includes a space 221a inside the fixing part 220b. The moving part 210b includes a body 211a, a neck 212b, and a head 213b. The head 213b protrudes from the body 211a to be removably coupled with the second coupling member 300a. The neck 212b is formed between the body 211a and the head 213b to connect the body 211a to the head 213b.

The neck 212b has a width that is narrower than that of the head 213b. The space 221a has a width that is wider than that of the body 211a such that the body 211a can move, i.e., slide in the space 221a.

The second coupling member 300a includes a housing 310a forming the outer appearance of the second coupling member 300a and including a coupling groove 311a. The first coupling member 280 further includes an elastic member accommodating part 340 and an elastic member 330a. The elastic member accommodating part 340 is formed outside the coupling groove 311a. The elastic member accommodating part 340 is depressed in the inner wall of the housing 310a to open into the coupling groove 311a. The elastic member 330a is accommodated in the elastic member accommodating part 340. The elastic member 330a may be in the shape of a ring. The elastic member 330a may press the neck 212b of the first coupling member 280 when the first coupling member 280 is inserted into the coupling groove 311a to prevent the first coupling member 280 from departing from the second coupling member 300a. At this time, the head 213b of the first coupling member 280 may act as a catching jaw. The elastic member 330a may include a spring.

Hereinafter, a process of coupling the first coupling member 280 with the second coupling member 300a will be described.

If the first coupling member 280 is coupled with the second coupling member 300a, the moving part 210b may be inserted into the coupling groove 311a. If the head 213b of the moving part 210b is inserted into the coupling groove 311a, the elastic member 330a that is in the shape of a ring may be deformed. The diameter of the elastic member 330a may increase. If the head 213b of the moving part 210b is completely inserted into the coupling groove 311a, a restoring force of the elastic member 330a may be applied. Accordingly, the elastic member 330a may press the neck 212b of the moving part 210b so that the first coupling member 280 may be completely coupled with the second coupling member 300a. In this way, the first coupling member 280 may be removably coupled with the second coupling member 300a in the snap button fashion. That is, the moving part 210b of the first coupling member 280 may be removably coupled with the coupling groove 311a of the second coupling member 300a in the snap button fashion.

FIGS. 16A and 16B are schematic cross-sectional views for describing a process of assembling the cover 90 and the second chassis 84 to which the first coupling member 280 and the second coupling member 300a are respectively applied according to the fifth exemplary embodiment. Hereinafter, descriptions overlapping those described above with reference to FIGS. 4 to 5D will be omitted. Also, reference numerals not shown in FIGS. 16A and 16B are shown in FIGS. 4 to 10.

As shown in FIGS. 16A and 16B, the fixing part 220b may be fixed at any one among the second chassis 84 and the cover 90 in which the first coupling member 280 can be provided. Also, the fixing part 220b may be fixed at any one among the second chassis 84 and the connecting member 110 in which the first coupling member 280 can be provided. Also, the fixing part 220b may be fixed at any one among the second chassis 84 and the stand 120 in which the first coupling member 280 can be provided. The fixing part 220b may be fixed at any one among the connecting bracket 100 and the first bracket 121 in which the first coupling member 280 can be provided.

The second coupling member 300a may be provided in the other one among the second chassis 84 and the cover 90 in correspondence to the first coupling member 280. Also, the second coupling member 300a may be provided in the other one among the second chassis 84 and the connecting member 110 in correspondence to the first coupling member 280. Also, the second coupling member 300a may be provided in the other one among the second chassis 84 and the stand 120 in correspondence to the first coupling member 280. The second coupling member 300a may be provided in the other one among the connecting bracket 100 and the first bracket 121 in correspondence to the first coupling member 280.

Figure 17:
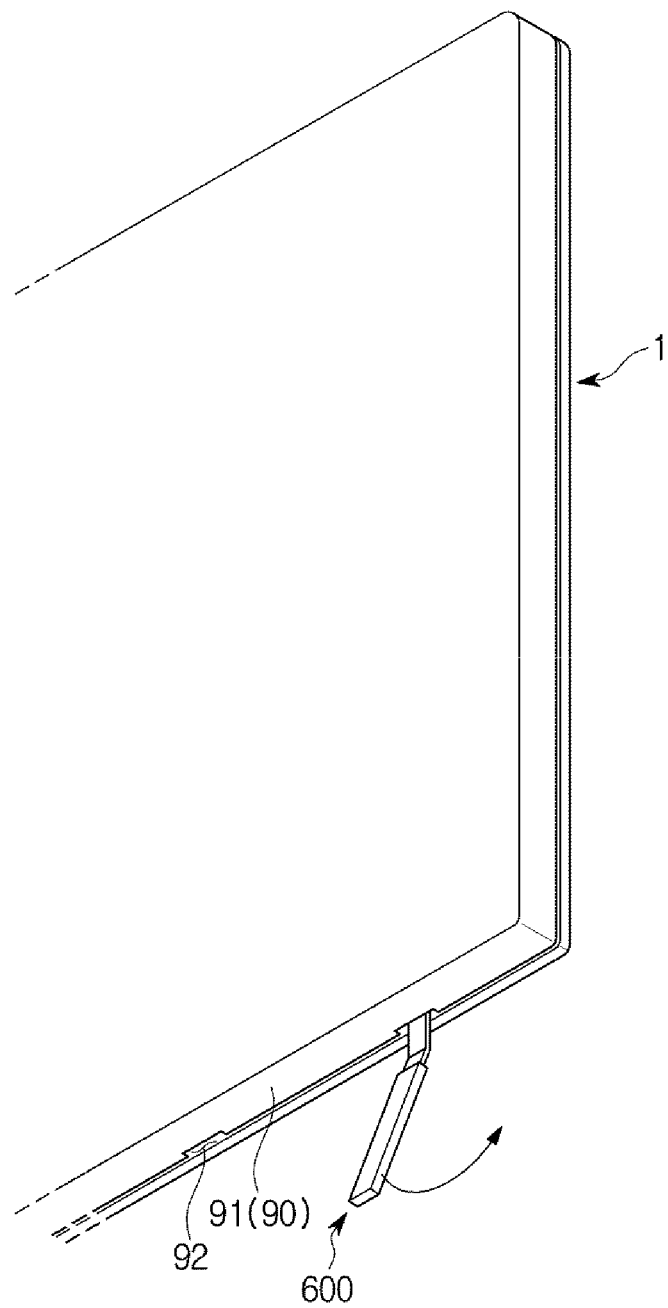
FIG. 17 is a view for describing a process of separating a cover of a display apparatus according to an exemplary embodiment.

FIG. 17 is a view for describing a process of separating the cover 90 of the display apparatus 1 according to an exemplary embodiment.

As shown in FIG. 17, a plurality of grooves 92 may be formed in the lower part of the display apparatus 1. The plurality of grooves 92 may be formed at predetermined intervals along a lower side 91 of the cover 90. The plurality of grooves 92 may be formed to correspond to any one among the first coupling member 280 and the second coupling member 300a, which is provided in the cover 90. That is, the plurality of grooves 92 may be formed in the lower part of any one among the first coupling member 280 and the second coupling member 300a, which is provided in the cover 90. Also, the number of the plurality of grooves 92 may be identical to that of any one(s) of the first coupling member 280 and the second coupling member 300a, which is provided in the cover 90.

A user may use a tool 600 to separate the cover 90 from the display apparatus 1. In this case, the user may easily separate the cover 90 using the principle of levers. If the user inserts the tool 600 into one among the plurality of grooves 92 and then presses the tool 600, coupling of the first coupling member 280 and the second coupling member 300a may be released so that the lower end of the display apparatus 1 opens. That is, the lower side 91 of the cover 90 may be separated from the display apparatus 1. If the lower end of the display apparatus 1 opens, the user can put his/her hand into the open gap to completely separate the cover 90 from the display apparatus 1. The tool 600 may be any one among various kinds of tools through which a user can use the principle of levers.

The cover 90 may be separated sequentially in the direction from the lower end of the display apparatus 1 to the upper end of the display apparatus 1. When the user uses the tool 600 to separate the cover 90 from the lower end of the display apparatus 1, the cover 90 may be separated sequentially in the direction from both edges of the lower end of the display apparatus 1 to the center of the lower end of the display apparatus 1. In contrast, the cover 90 may be assembled sequentially in the direction from the upper end of the display apparatus 1 to the lower end of the display apparatus 1. When the cover 90 is assembled to the upper end of the display apparatus 1, the cover 90 may be assembled sequentially in the direction from both edges of the upper end of the display apparatus 1 to the center of the upper end of the display apparatus 1.

The snap buttons can be applied to couple at least one frame supporting electronic components in an electronic product with a cover forming the outer appearance of the electronic product, which will be described later. The snap buttons may include the first coupling members 200, 250, 260, 270, and 280 having the moving parts 210, 210a, and 210b, and the second coupling members 300 and 300a having the coupling grooves 311 and 311a with which the moving parts 210, 210a, and 210b are removably coupled. The moving parts 210, 210a, and 210b of the first coupling members 200, 250, 260, 270, and 280 may be movably coupled with the fixing parts 220, 220*a*, and 220*b* of the first coupling members 200, 250, 250, 270, and 280. That is, the snap buttons may include the first coupling members 200, 250, 260, 270, and 280 including the moving parts 210, 210*a*, and 210*b* whose position can be adjusted, and the second coupling members 300 and 300*a* including the coupling grooves 311 and 311*a* with which the moving parts 210, 210*a*, are 210*b* are removably coupled. The first coupling member 200, 250, 260, 270, and 280 may further include the fixing parts 220, 220*a*, and 220*b* to which the moving parts 210, 210*a*, and 210*b* are slidingly coupled. The fixing parts 220, 220*a*, and 220*b* may include the space 221 inside the fixing parts 220, 220*a*, and 220*b*, and the moving parts 210, 210*a*, and 210*b* may include the bodies 211 and 211*a* that slide in the space 221, and the heads 213, 213*a*, and 213*b* protruding from the bodies 211 and 211*a* to be removably coupled with the coupling grooves 311 and 311*a*. The space 221 has a width that is wider than that of the bodies 211 and 211*a* such that the bodies 211 and 211*a* can move in the space 211. The electronic product may include a plurality of electronic components.

Figure 18:
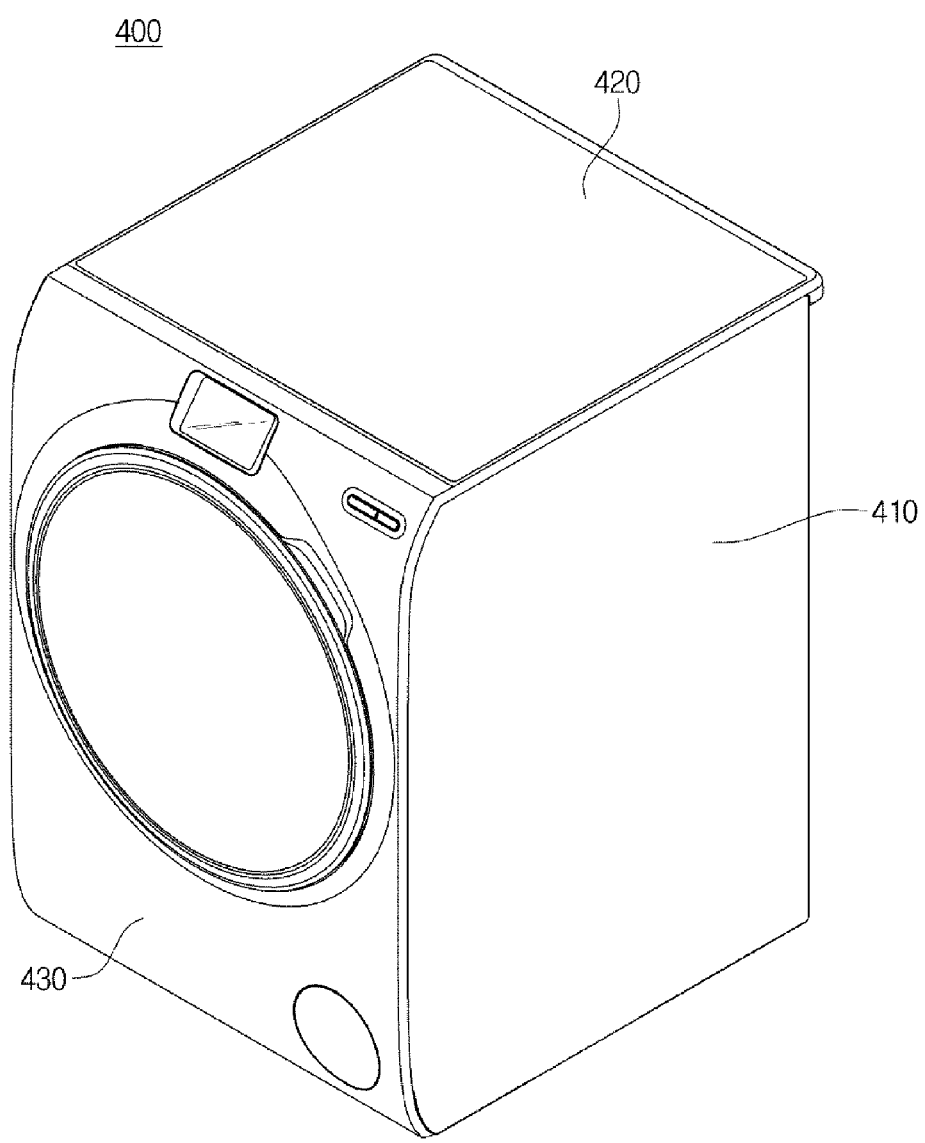
FIG. 18 is a perspective view of an electronic product to which a first coupling member and a second coupling member of a display apparatus according to an exemplary embodiment can be applied.

FIG. 18 is a perspective view of an electronic product to which the first coupling member 200, 250, 260, 270, or 280 and the second coupling member 300 or 300*a* of the display apparatus 1 according to an exemplary embodiment can be applied. FIG. 18 shows a washing machine 400 as an example of the electronic product.

As shown in FIG. 18, the first coupling member 200, 250, 260, 270, or 280 and the second coupling member 300 or 300*a* may be applied to the washing machine 400. That is, the first coupling member 200, 250, 260, 270, or 280 and the second coupling member 300 or 300*a* may be used to assemble frames forming the outer appearance of the washing machine 400. The washing machine 400 includes side frames 410, a back frame, a top frame 420, a bottom frame, and a front frame 430 that are coupled with each other to form the outer appearance of the washing machine 400. The side frames 410 may form the outer appearance of both sides of the washing machine 400, and the back frame may form the outer appearance of the back part of the washing machine 400. The top frame 420 may form the outer appearance of the top part of the washing machine 400, and the bottom frame may form the outer appearance of the bottom of the washing machine 400. The front frame 430 may form the outer appearance of the front part of the washing machine 400. The shapes of the first coupling member 200, 250, 260, 270, or 280 and the second coupling member 300 or 300*a*, and a process of coupling the first coupling member 200, 250, 260, 270, or 280 with the second coupling member 300 or 300*a* have been described above, and accordingly, further descriptions thereof will be omitted.

Figure 19:
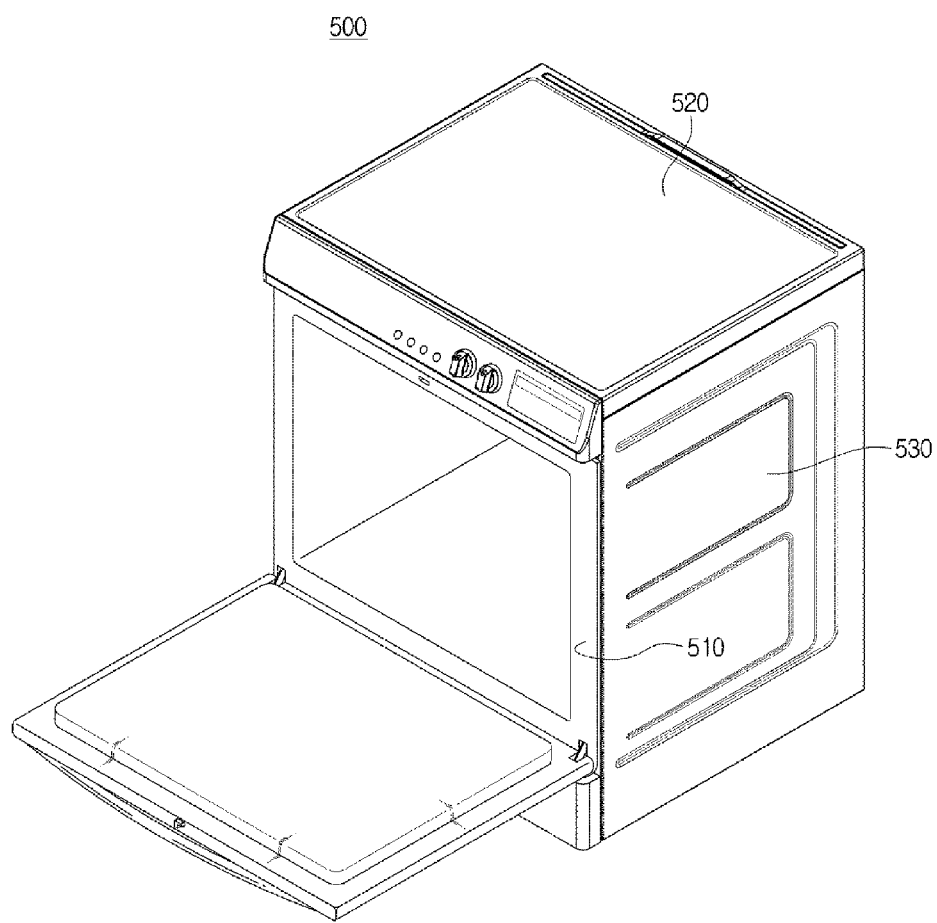
FIG. 19 is a perspective view of another electronic product to which a first coupling member and a second coupling member of a display apparatus according to an exemplary embodiment can be applied.

FIG. 19 is a perspective view of another electronic product to which the first coupling member 200, 250, 260, 270, or 280 and the second coupling member 300 or 300*a* of the display apparatus 1 according to an exemplary embodiment can be applied. FIG. 19 shows an oven 500 as another example of the electronic product.

As shown in FIG. 19, the first coupling member 200, 250, 260, 270, or 280 and the second coupling member 300 or 300*a* can be applied to the oven 500. That is, the first coupling member 200, 250, 260, 270, or 280 and the second coupling member 300 or 300*a* may be used to assemble panels forming the outer appearance of the oven 500. The oven 500 includes a front panel 510, a top panel 520, side panels 530, a back panel, and a bottom panel that are coupled with each other to form the outer appearance of the oven 500. The front panel 510 may form the outer appearance of the front part of the oven 500, and the top panel 520 may form the outer appearance of the top part of the oven 500. The side panels 530 may form the outer appearance of both sides of the oven 500, and the back panel may form the outer appearance of the back part of the oven 500. Also, the bottom panel may form the outer appearance of the bottom of the oven 500. The shapes of the first coupling member 200, 250, 260, 270, or 280 and the second coupling member 300 or 300*a*, and a process of coupling the first coupling member 200, 250, 260, 270, or 280 with the second coupling member 300 or 300*a* have been described above, and accordingly, further descriptions thereof will be omitted.

As such, the first coupling member 200, 250, 260, 270, or 280 and the second coupling member 300 or 300*a* can be used to assemble various kinds of electronic products. The first coupling member 200, 250, 260, 270, or 280 and the second coupling member 300 or 300*a*, that is, the snap buttons may be used to assemble various kinds of electronic products, as well as the washing machine 400 and the oven 500. The above description relates to snap buttons that can be used to assemble components forming the outer appearance of an electronic product; however, the snap buttons can be applied to assemble components forming the internal structure of an electronic product, as well as the outer appearance of the electronic product.

By assembling the display apparatus using the snap buttons without using screws, it is possible to overcome problems of high manufacturing costs and long manufacturing time caused by the use of screws.

Also, because the snap buttons, instead of screws, are used to assemble the display apparatus, it is unnecessary to decide the thickness of the display apparatus in consideration of the length of the threads of the screws, which leads to the slim design of the display apparatus.

If the first coupling member including the moving part whose position can be adjusted and the second coupling member with which the moving part is removably coupled are applied to the display apparatus, it is possible to easily assemble the display apparatus even when the lengths of components constituting the display apparatus change due to environmental factors, because the moving part of the first coupling member can slide.

The foregoing exemplary embodiments are examples and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A display apparatus comprising: a display panel; a first chassis disposed on a front side of the display panel; a second chassis disposed on a rear side of the display panel; a cover removably coupled with the second chassis in a snap button fashion; a first coupling member disposed on a front surface of the cover, the first coupling member comprising a moving part that is movable; and a second coupling member disposed in a rear side of the second chassis and on the rear side of the display panel, the moving part being removably and directly coupled with the second coupling member; and wherein the first coupling member further comprises a fixing part disposed on the front surface of the cover and coupled with the moving part, the moving part being movable in the fixing part.

2. The display apparatus of claim 1, wherein the fixing part comprises a space in the fixing part, and the moving part comprises: a body disposed in the space and movable in the space, the body having a width that is narrower than a width of the space; and a head protruding from the body and removably coupled with the second coupling member.

3. A display apparatus comprising:
   a display panel;
   a first chassis disposed at a front side the display panel;
   a second chassis disposed at a rear side the display panel, the first chassis and the second chassis supporting the display panel with the first chassis, and the second chassis being removably coupled with the first chassis in a snap button fashion;
   first buttons disposed at intervals in the second chassis, each of the first buttons comprising a coupling groove;
   a connecting member coupled with the first chassis; and
   second buttons disposed on the connecting member, and removably coupled with the first buttons,
   wherein each of the second buttons comprises:
      a fixing part; and
      a moving part coupled with the fixing part and slidable in the fixing part, the moving part being removably coupled with the coupling groove.

4. The display apparatus of claim 3, wherein the fixing part comprises a space in the fixing part, and
   the moving part comprises:
      a body disposed in the space and slidable in the space; and
      a head protruding from the body and removably coupled with the coupling groove.

5. The display apparatus of claim 3, further comprising a stand removably coupled with the second chassis in a snap button fashion and configured to make the display panel stand.

6. A display apparatus comprising:
   a display panel;
   a first support member and a second support member, the first support member and the second support member supporting the display panel;
   a cover removably coupled with the second support member;
   a first coupling member disposed on the cover, and the first coupling member comprising a moving part that is movable;
   a second coupling member disposed in the second support member, the moving part being removably coupled with the second coupling member; and
   a stand disposed below the display panel and removably coupled with the second coupling member.

7. The display apparatus of claim 6, wherein the first coupling member further comprises a fixing part disposed on the cover and coupled with the moving part, the moving part being movable in the fixing part.

8. The display apparatus of claim 7, wherein the fixing part comprises a space in the fixing part, and
   the moving part comprises:
      a body disposed in the space and movable in the space; and
      a head protruding from the body and removably coupled with the second coupling member.

9. The display apparatus of claim 8, wherein the space has a width that is wider than a width of the body so that the body is movable in the space.

10. The display apparatus of claim 6, wherein the moving part is removably coupled with the second coupling member in a snap button fashion.

11. The display apparatus of claim 6, wherein the first support member comprises a first chassis disposed in front of the display panel, and
   the second support member comprises a second chassis disposed behind the display panel.

* * * * *